(12) United States Patent
Kim et al.

(10) Patent No.: US 12,362,205 B2
(45) Date of Patent: *Jul. 15, 2025

(54) PICK AND PLACEMENT OF SEMICONDUCTOR CHIPS BASED ON NOZZLELESS SELF-FOCUSING ACOUSTIC DROPLET EJECTOR

(71) Applicant: UNIVERSITY OF SOUTHERN CALIFORNIA, Los Angeles, CA (US)

(72) Inventors: Eun Sok Kim, Rancho Palos Verdes, CA (US); Yongkui Tang, Pasadena, CA (US)

(73) Assignee: University of Southern California, Los Angeles, CA (US)

( * ) Notice: Subject to any disclaimer, the term of this patent is extended or adjusted under 35 U.S.C. 154(b) by 1030 days.

This patent is subject to a terminal disclaimer.

(21) Appl. No.: 17/327,489

(22) Filed: May 21, 2021

(65) Prior Publication Data
US 2021/0366744 A1    Nov. 25, 2021

Related U.S. Application Data

(60) Provisional application No. 63/028,780, filed on May 22, 2020.

(51) Int. Cl.
*H01L 21/67* (2006.01)
*B06B 1/06* (2006.01)
(Continued)

(52) U.S. Cl.
CPC ...... *H01L 21/67144* (2013.01); *B06B 1/0651* (2013.01); *B06B 1/067* (2013.01);
(Continued)

(58) Field of Classification Search
CPC ............ H01L 21/67144; H01L 21/68; H01L 24/75; H01L 24/00; H01L 224/75655;
(Continued)

(56) References Cited

U.S. PATENT DOCUMENTS

| | | | | |
|---|---|---|---|---|
| 5,591,490 A | * | 1/1997 | Quate | ................ B05B 17/0615 427/457 |
| 7,719,170 B1 | * | 5/2010 | Kim | ...................... H10N 30/06 310/335 |
| 11,623,248 B2 | * | 4/2023 | Kim | ..................... B06B 1/0696 310/335 |

(Continued)

OTHER PUBLICATIONS

Lee, C.-Y. et al., "Harmonic operation of acoustic transducer for droplet ejection application," in Proc. Transducers Int. Solid-State Sensors, Actuat. Microsyst. Conf., Jun. 2007, pp. 1283-1286.

Tang, Y. et al., "On-demand, heatless ejection of sub-MM-sized liquid droplets," in Proc. IEEE 30th Int. Conf. Micro Electro Mech. Syst. (MEMS), Jan. 2017, pp. 1196-1199.

(Continued)

*Primary Examiner* — J. San Martin
(74) *Attorney, Agent, or Firm* — Brooks Kushman P.C.

(57) ABSTRACT

A device for picking and placing semiconductor chips includes a liquid having a first surface and a second surface and a layer of semiconductor chips disposed over the first surface. Characteristically, the first surface is a liquid-air interface. The device also includes a focused ultrasonic transducer positioned to focus acoustic wave on the layer of semiconductor chips such that a droplet including at least one semiconductor chip is ejected through the liquid-air per each actuation of the focused ultrasonic transducer through droplet ejection. The focused ultrasonic transducer includes a piezoelectric substrate having a top face and a bottom face, a Fresnel acoustic lens including a plurality of annular rings of air cavities disposed on the top face, and a first patterned circular electrode disposed over the top face and a second patterned circular electrode disposed over the bottom face. The first patterned circular electrode overlaps the second patterned circular electrode.

23 Claims, 20 Drawing Sheets
(9 of 20 Drawing Sheet(s) Filed in Color)

(51) Int. Cl.
    *H01L 21/673* (2006.01)
    *H01L 21/68* (2006.01)
    *H01L 23/00* (2006.01)

(52) U.S. Cl.
    CPC ........ *H01L 21/67333* (2013.01); *H01L 21/68* (2013.01); *H01L 24/75* (2013.01); *B06B 2201/77* (2013.01); *H01L 2224/75653* (2013.01); *H01L 2224/75655* (2013.01)

(58) Field of Classification Search
    CPC ................ B06B 1/0651; B06B 1/067; B06B 2201/77; G10K 11/30
    See application file for complete search history.

(56) References Cited

U.S. PATENT DOCUMENTS

| | | | |
|---|---|---|---|
| 12,017,210 B2* | 6/2024 | Kim | B06B 1/0651 |
| 2021/0101178 A1* | 4/2021 | Kim | G02B 3/08 |
| 2023/0402308 A1* | 12/2023 | Stokkermans | H01L 21/68 |
| 2024/0178342 A1* | 5/2024 | Oh | H01L 24/95 |

OTHER PUBLICATIONS

Tang, Y. et al., "Electrical tuning of focal size with single focused ultrasonic transducer," in Proc. IEEE Int. Ultrason. Symp., Oct. 2018, pp. 1-4.

Tang, Y. et al., "Acoustic droplet-assisted particle ejection through and from agarose-gel-filled Petri dish," in Proc. IEEE Int. Ultrason. Symp., Oct. 2019, pp. 64-67.

* cited by examiner

PICK AND PLACEMENT OF SEMICONDUCTOR CHIPS BASED ON NOZZLELESS SELF-FOCUSING ACOUSTIC DROPLET EJECTOR

CROSS-REFERENCE TO RELATED APPLICATIONS

This application claims the benefit of U.S. provisional application Ser. No. 63/028,780 filed May 22, 2020, the disclosure of which is hereby incorporated in its entirety by reference herein.

STATEMENT REGARDING FEDERALLY SPONSORED RESEARCH OR DEVELOPMENT

The invention was made with Government support under Contract No. CNS 1716953 awarded by the National Science Foundation (NSF). The Government has certain rights to the invention.

TECHNICAL FIELD

In at least one aspect, the present invention is related to devices that eject semiconductor chips into droplets.

BACKGROUND

In semiconductor packaging (e.g., the assembly of surface mount devices (SMDs) or micro-light-emitting diodes (micro-LEDs)), individual chips need to be precisely picked and placed onto various substrates, and a sophisticated system equipped with robotic arms, each carrying multiple nozzles with vacuum suction is commonly used for such tasks [1]. The system is usually expensive and bulky due to its complexity. With many moving parts, mechanical failures become a concern, and building a system with massively parallel processing capability is highly challenging. The nozzles in the system, handling tens of thousands parts per hour, suffer from wear and tear that can cause deformation and damage, which may lead to loss of vacuum (and thus holding power), shifts in picking or placing positions, or even part damage, increasing the assembly failure rate [2]. In addition, the nozzle size limits the system's ability to handle very small chips, and different nozzle size is needed in order to handle chips of different sizes. As a result, a cheaper and smaller system having no moving parts or nozzles and with the capability for massively parallel processing and handling very small chips is highly desirable. To realize such a system, we come up with the idea of utilizing liquid droplets ejected by high-intensity acoustic waves to carry semiconductor chips to the target position.

Acoustic droplet ejection (ADE) was first reported in the scientific literature in 1927 [3], where oil droplets were observed to be ejected from the liquid surface by continuous acoustic waves of high energy generated by a piezoelectric quartz resonator. In 1989, this phenomenon was systemically studied with both experiments and numerical simulations using tone bursts of focused acoustic energy [4]. The high energy from focused acoustic waves can overcome restraining forces from surface tension and gravity to eject liquid droplets at high speed without relying on physical contact or nozzles, which reduces maintenance cost and the risk of contact contamination. The technology also works with a wide range of liquids such as water [4], isopropyl alcohol (IPA) and ethanol [5], acetone and photoresist [6], ink [7], liquid metal [8], and various reagents used in life sciences [9]-[12], and the ejection direction, as well as droplet volume, can be controlled with high accuracy and precision [13]. These attractive features lead to the development of simple and cost-efficient ADE tools that use ejected droplets to transfer liquids or solids for applications such as inkjet printing [7], bio-reagent transferring [9]-[10], cell transferring [11]-[12], microsphere delivery [14], DNA [15] and protein [16] synthesis, and crystallography [17].

To effectively generate high-intensity ultrasound for droplet ejection, the acoustic waves generated by a transducer has to be focused, and curved surfaces on the transducer itself [18] or acoustic lens attached to it [4] have been used for focusing. However, curvature error and surface roughness of these usually macro-machined or 3D-printed curved surfaces are hard to control. Alternatively, focusing can be realized by controlling the time delay of the driving signal applied on each element of a phased array [19], which involves complicated driving electronics with many electrical connections, making the system bulky and complex. Another method for focusing ultrasound uses a thin, planar, microfabricated Fresnel acoustic lens. Single-[20] and multi-layer [5] acoustic Fresnel lenses have been microfabricated through etching and bonding to thin-film transducers, with challenges in precisely controlling the layer thickness. On the other hand, our previously reported fully microfabricated self-focusing acoustic transducers (SFATs) [21] with annular-ring air-cavity Fresnel lenses are easy to be manufactured since the layer thickness control is not critical, and no bonding of the lens is needed. With these SFAT-based droplet ejectors, the demonstrated ejection rate is up to 8 kHz [22], and the transducers can be formed into arrays for parallel ejection of multiple droplets [15], [16]. Moreover, the size of droplets ejected by the SFATs can be tuned through electrically controlling the number of activated Fresnel rings [23] or designing transducers working at different frequencies [14], [22]. These advantages make SFAT-based droplet ejectors a good tool for semiconductor chip ejection. However, the previous SFAT-based droplet ejectors have relatively small droplet size (up to 560 μm [23]), which is not large enough to generate droplets for carrying most semiconductor chips.

Accordingly, there is a need for improved methods and systems for delivering silicon chips with a nozzleless generated droplets.

SUMMARY

In at least one aspect, an SFAT-based liquid ejector device for selecting and placing semiconductor chips is provided. The SFAT-based liquid ejector device includes a liquid having a first surface and a second surface and a layer of semiconductor chips disposed over the first surface. Characteristically, the first surface is a liquid-air interface. The device also includes a focused ultrasonic transducer positioned to focus acoustic wave on the layer of semiconductor chips such that a droplet including at least one semiconductor chip is ejected through the liquid-air per each actuation of the focused ultrasonic transducer through droplet ejection. The focused ultrasonic transducer includes a piezoelectric substrate having a top face and a bottom face, a Fresnel acoustic lens including a plurality of annular rings of air cavities disposed on the top face, and a first patterned circular electrode disposed over the top face and a second patterned circular electrode disposed over the bottom face. The first patterned circular electrode overlaps the second patterned circular electrode.

In another aspect, a method for selecting and placing semiconductor chips using the SFAT-based liquid ejector device is provided. The method includes a step of providing a layer of semiconductor chips disposed over a first surface of a liquid, the first surface being a liquid-air and focusing an acoustic wave on the layer of semiconductor chips with a focused ultrasonic transducer such that a droplet including at least one semiconductor chip is ejected through the liquid-air interface per each actuation of the focused ultrasonic transducer through droplet ejection.

In another aspect, an SFAT-based liquid ejector achieves a focal size as large as 1 mm and is capable of ejecting droplets to carry silicon chips (floating on the liquid surface) as large as $3.1 \times 3.1 \times 0.4$ mm$^3$.

In another aspect, a single-element planar, focused ultrasound transducer includes a PZT-based piezoelectric sound source for generating ultrasound waves with an acoustic Fresnel lens on top. The Fresnel lens is designed to focus the generated waves into a focal zone larger than 1 mm in diameter.

In another aspect, a nozzleless, heatless droplet ejection at liquid-air interface based on focused ultrasound generated by the focused ultrasonic transducer with controllability of droplet size (from 0.85 to 2.49 mm) with varied driving pulse widths and driving voltages is provided.

In another aspect, liquid droplets ejected by the nozzleless droplet ejector are used to carry semiconductors chips on-demand, with faster speed, smaller system size (massive parallel processing possible with an array of the ejectors), as well as cheaper manufacturing and operation cost compared to conventional robotic-arm based semiconductor-chip-pick-and-place systems, while also being able handle semiconductor chips that are too small for the robotic arms to handle.

In another aspect, a guiding cover includes an embedded fluidic channel for semi-automatic loading of silicon chips to the ejection site of the ejector, so that picking and placement of semiconductor chips can be done with minimal manual labor. The guiding cover pulls in the semiconductors chips by liquid flow due to reduced local liquid level in the flow channel caused by weaker ejection of droplets from the flow channel into an area outside the cover but still above the liquid reservoir.

In still another aspect, SFAT-based liquid ejector provides on-demand picking and placing of semiconductor chips. The ejector, based on planar annular-ring air-cavity acoustic Fresnel lens, is capable of focusing acoustic beam to eject liquid droplets whose diameter is from 0.85 to 2.49 mm. The ejected droplets can carry 0.4-mm-thick square silicon chips with a side length from 0.7 to 3.1 mm, which can be collected on a substrate to form a two-dimensional array of the chips or to place them in semiconductor packages.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a further understanding of the nature, objects, and advantages of the present disclosure, reference should be made to the following detailed description, read in conjunction with the following drawings, wherein like reference numerals denote like elements and wherein.

DETAILED DESCRIPTION

Figure 1A:
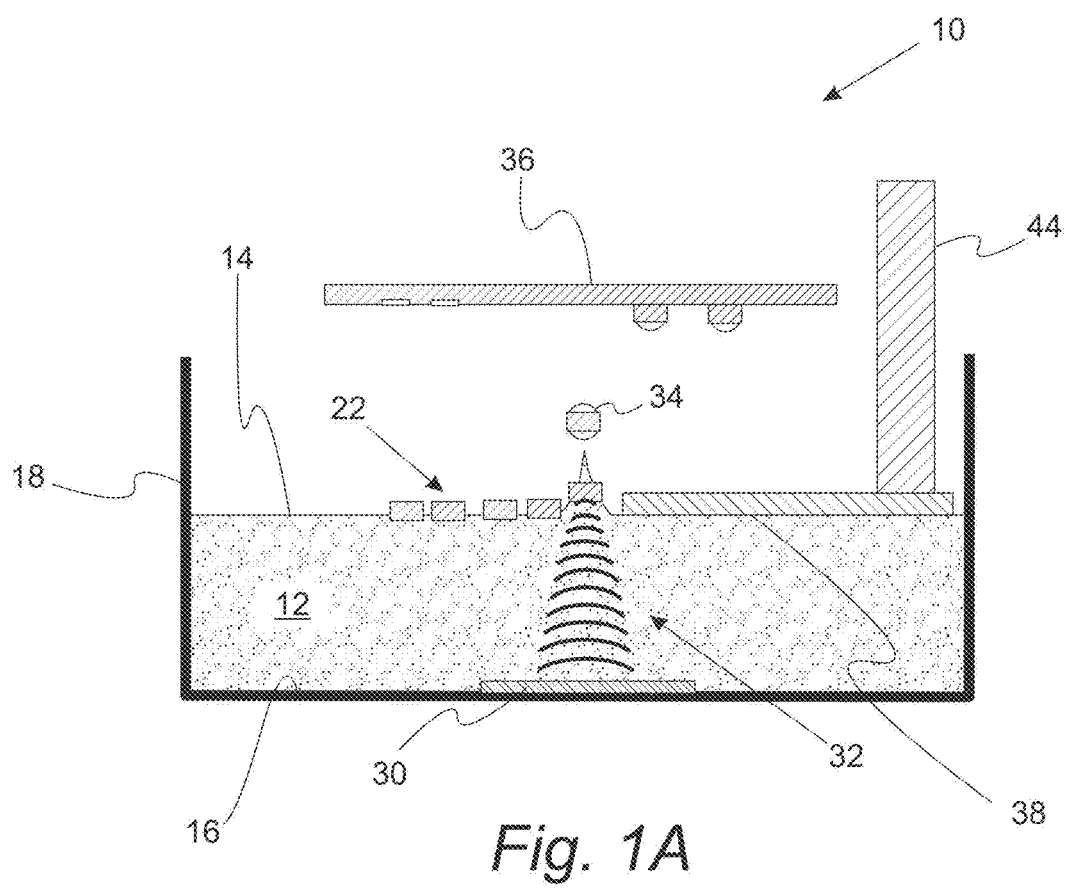
FIG. 1A. Cross-sectional diagram of the droplet-assisted semiconductor chip ejection through a single liquid (e.g., water, sodium polytungstate (SPT), etc.) droplet per actuation pulse from a container containing the liquid.

Reference will now be made in detail to presently preferred embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

It should also be appreciated that integer ranges explicitly include all intervening integers. For example, the integer range 1-10 explicitly includes 1, 2, 3, 4, 5, 6, 7, 8, 9, and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1. to 2.1 the following numbers 1.2, 1.3, 1.4, 1.5, 1.6, 1.7, 1.8, 1.9, and 2.0 can be selected as lower or upper limits.

In the examples set forth herein, concentrations, temperature, frequencies, and device parameters can be practiced with plus or minus 50 percent of the values indicated rounded to or truncated to two significant figures of the value provided in the examples. In a refinement, concentrations, temperature, frequencies, and device parameters can be practiced with plus or minus 30 percent of the values indicated rounded to or truncated to two significant figures of the value provided in the examples. In another refinement, concentrations, temperature, frequencies, and device parameters can be practiced with plus or minus 10 percent of the values indicated rounded to or truncated to two significant figures of the value provided in the examples.

For any device described herein, linear dimensions and angles can be constructed with plus or minus 50 percent of the values indicated rounded to or truncated to two significant figures of the value provided in the examples. In a refinement, linear dimensions and angles can be constructed with plus or minus 30 percent of the values indicated rounded to or truncated to two significant figures of the value provided in the examples. In another refinement, linear dimensions and angles can be constructed with plus or minus 10 percent of the values indicated rounded to or truncated to two significant figures of the value provided in the examples.

The term "one or more" means "at least one" and the term "at least one" means "one or more." The terms "one or more" and "at least one" include "plurality" as a subset.

The term "substantially," "generally," or "about" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

It should be appreciated that in any figures for electronic devices, a series of electronic components connected by lines (e.g., wires) indicates that such electronic components are in electrical communication with each other. Moreover, when lines directed connect one electronic component to another, these electronic components can be connected to each other as defined above.

Throughout this application, where publications are referenced, the disclosures of these publications in their entireties are hereby incorporated by reference into this application to more fully describe the state of the art to which this invention pertains.

Abbreviations

"PZT" means zirconate titanate.
"SFAT" means self-focusing acoustic transducers.
"SPT" means sodium polytungstate.
"Vpp" means peak-to-peak voltage.

With reference to FIG. 1A, an ejector device for picking and placing semiconductor chips is provided. Ejector device 10 includes a liquid 12 having a first surface 14 and a second surface 16. Typically, liquid 12 is water or an aqueous solution (such as an SPT-containing solution). Therefore, the liquid 12 may be held in a container 18 (e.g., a beaker). A layer of semiconductor chips 22 are disposed over the first surface 14. Characteristically, first surface 14 is a liquid-air interface. In a refinement, liquid 12 has a higher density than that of the chips 22 so that the chips float on the first surface 14. Focused ultrasonic transducer 30 is positioned to focus acoustic wave 32 on the layer of semiconductor chips 22 such that droplets 34, including at least one semiconductor chip, are ejected through first surface 14 per each actuation of focused ultrasonic transducer 30 through droplet ejection. In a refinement, each droplet 34 includes a single semiconductor chip. Acoustic wave 32 is focused at a focal zone at focal length F. In a refinement, the focused ultrasonic transducer 30 defines a focal length from about 0.5 mm to about 40 mm. Sometimes focused ultrasonic transducer 30 is referred to as an SFAT. Collection plate 36 can be used to collect the ejected droplets 34.

Figure 1B:
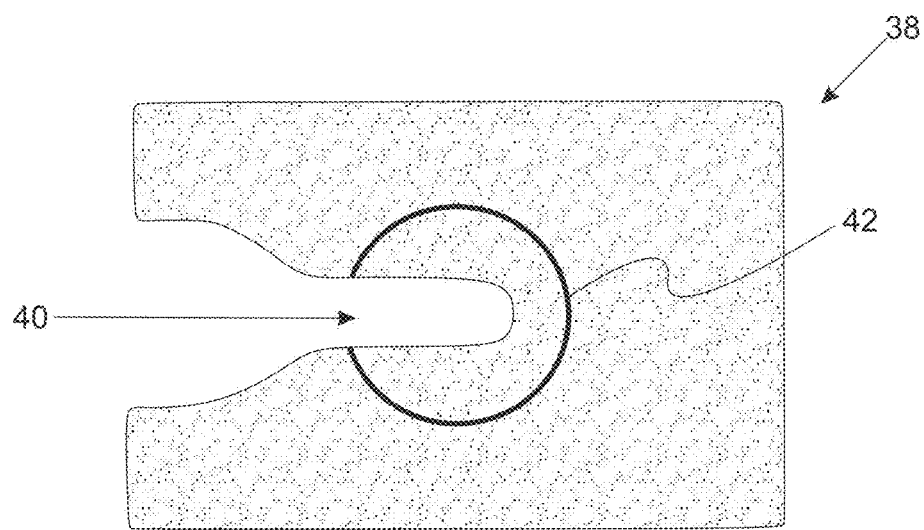
FIG. 1B. Top view of a cover used to guide the semiconductor chips to an ejection site.

Referring to FIGS. 1A and 1B, a cover used to guide the semiconductor chips to an ejection site is provided. FIG. 1B is a top view of the cover. In a variation, ejector device 10 includes cover 38 that defines a flow channel 40 to guide the semiconductor chips to an ejection site. In a refinement, cover 38 defines visual indicator 42 (e.g., a groove therein) to align the cover to a center Fresnel circle of the focused ultrasonic transducer 30. In a further refinement, a moveable stage 44 holds cover 38 at the first surface 14, thereby allowing fine-tuning of the liquid level held by surface tension.

In a variation, the focused ultrasonic transducer 30 is configured to operate at a plurality of different frequencies. Typically, the different frequencies are in the range 1 to 180 MHz.

In another variation, the ejector device 10 includes a plurality of focused ultrasonic transducers 30 configured to operate at plurality of different focal lengths with different focal diameters. The focused ultrasonic transducer can be configured to produce a plurality of focal lengths and also a plurality of focal sizes by varying the magnitude and/or pulsewidth of the applied voltage.

In another variation, a plurality of the focused ultrasonic transducers 30 is configured to eject a plurality of semiconductor chips onto a plurality of receiving sites. In a refinement, a plurality of covers 38 is configured to guide a plurality of semiconductor chips to a plurality of ejection sites.

Figure 2A:
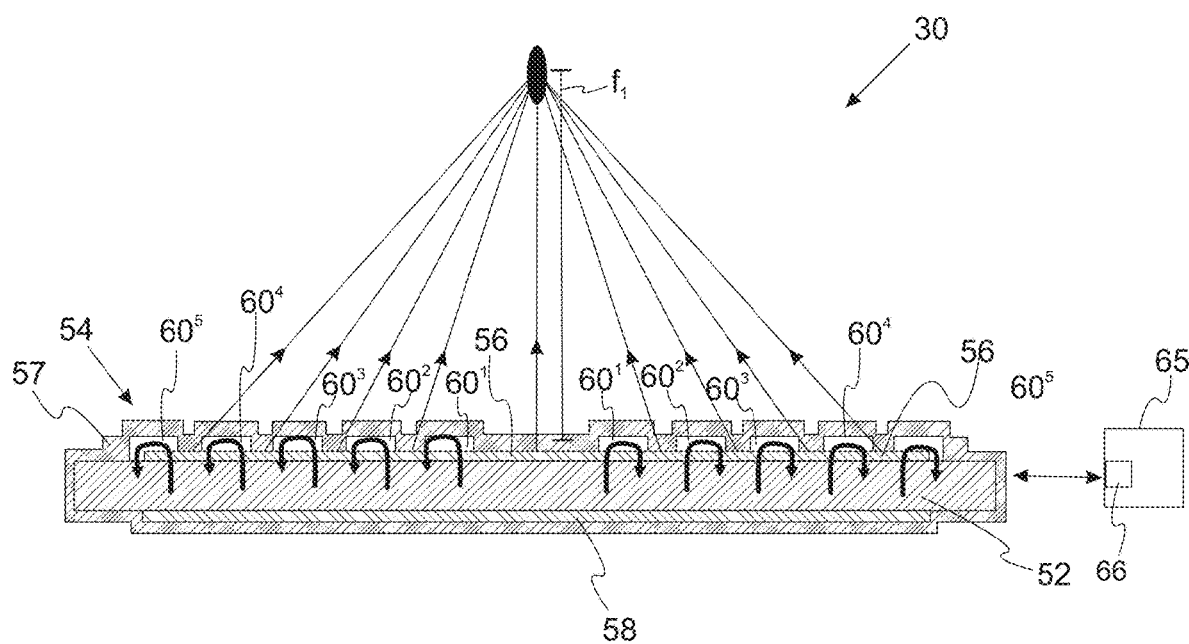
FIG. 2A. Schematic of a Self-focusing Acoustic Transducer (SFAT) used in the ejection experiment of FIG. 1A.
Figure 2B:
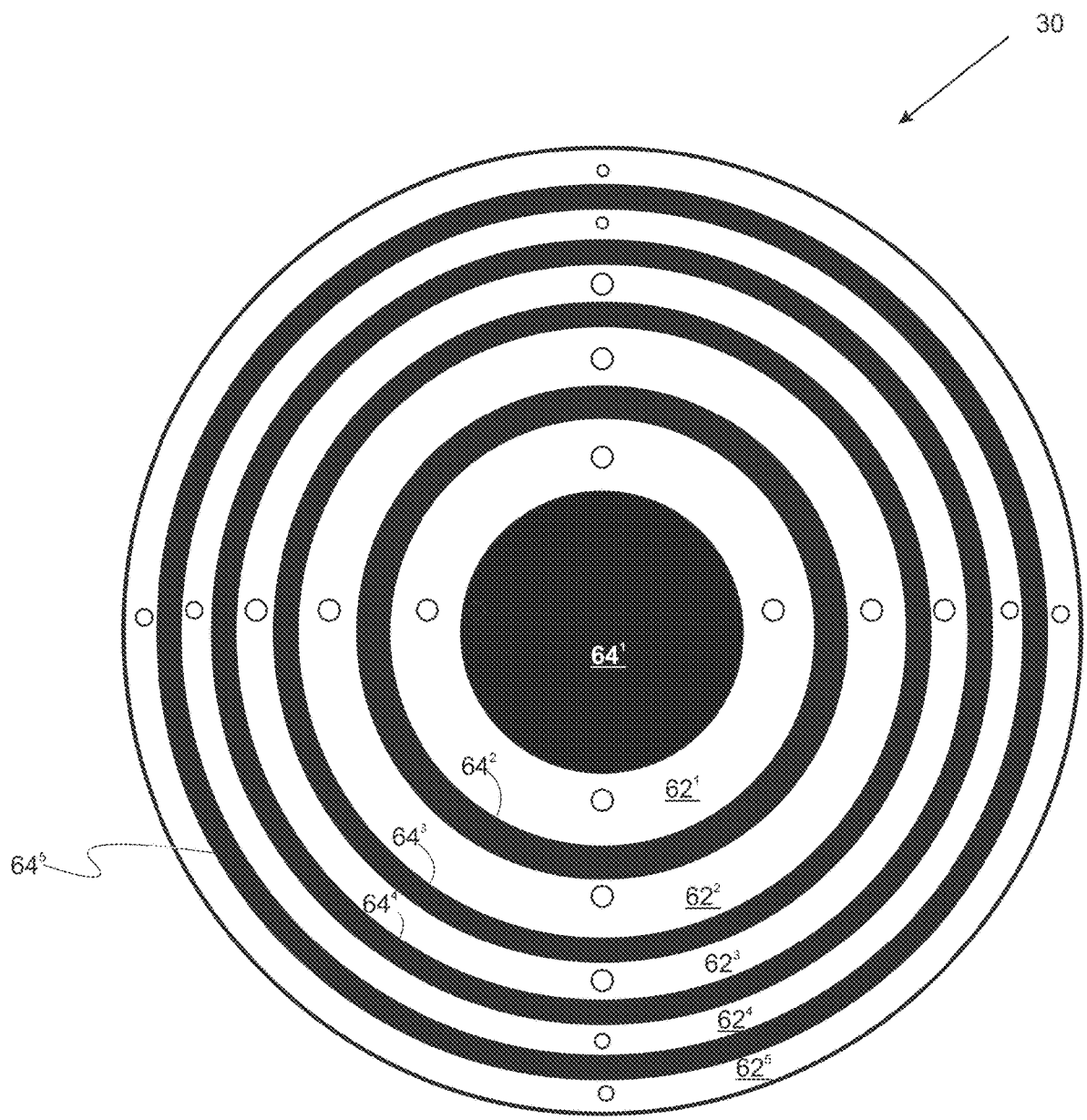
FIG. 2B. Top view of the Self-focusing Acoustic Transducer of FIG. 2A.

With reference to FIGS. 2A and 2B, focused ultrasonic transducer 30 includes piezoelectric substrate 52 having a top face and a bottom face. An example of a useful piezoelectric substrate is lead zirconate titanate (PZT). Typically, the piezoelectric substrate has an ultrasonic fundamental thickness-mode resonant frequency (e.g., from about 1 to 180 MHz). Fresnel acoustic lens 54 includes a first metal layer 56 disposed over the top face of piezoelectric substrate 52. Similarly, a second metal layer 58 is disposed over the bottom face of piezoelectric substrate 52. First metal layer 56 is a patterned metal layer that defines a first patterned circular electrode, while second metal layer 58 is a patterned metal layer that defines a second patterned circular electrode. Each of the first metal layer 56 and second metal layer 58 are composed of a metal such as nickel. Characteristically, the first circular electrode 56 overlaps the second circular electrode 58.

A plurality of annular rings of air cavities $60^i$ are disposed over the top face of piezoelectric substrate 52 and over first metal layer 56 where i is an integer label for each annular ring air cavity. The label i is an integer i=1 to $i_{max}$ where $i_{max}$ is the total number of air cavity rings. Air cavities noted with lower values of i are closer to the center of focused ultrasonic transducer 30. In a refinement, the plurality of annular rings of air cavities are patterned into Fresnel half-wavelength annular rings for a focal length F. The air cavities are defined by an encapsulating polymer (e.g., Parylene) that is disposed over the top face of piezoelectric substrate 52 or encapsulates the piezoelectric substrate 52, first metal layer 56, and second metal layer 58. Examples of encapsulating polymers include, but are not limited to, polyesters (e.g., polyethylene terephthalate, poly(ethylene 2,6-naphthalate)), polycarbonates, polyimides, polyvinyl chloride, polystyrenes, acrylic polymer (e.g., polymethyl methacrylate, polyolefins (e.g., polypropylene), polysiloxanes, polyamides, polyvinylidene fluoride, ethylene-vinyl acetate copolymer, ethylene-vinyl alcohol copolymer, polyvinyl acetate, parylenes (e.g., Parylene C, N, and D), polyureas, polytetrafluoroethylene, epoxy resins, SU-8, polydimethylsiloxane, and the like. Parylene C is found to be particularly useful for this encapsulation. In a refinement, the plurality of annular rings of air cavities are patterned into Fresnel half-wavelength annular rings.

Referring to FIG. 2B, a top view of focused ultrasonic transducer 30 is provided. Air cavity ring regions $62^1$, $62^2$, $62^3$, $62^4$, $62^5$ include air cavities $60^1$, $60^2$, $60^3$, $60^4$, $60^5$ encapsulated therein. Also depicted are polymer-covered electrode regions $64^1$, $64^2$, $64^3$, $64^4$, $64^5$, which are regions in which the polymer encapsulant overlap the metal electrode but do not include encapsulated air cavity rings.

In a variation, focused ultrasonic transducer 30 further includes controller 62 that actuates the electrodes. This controller includes circuitry 66 to apply an actuation voltage between electrodes 56 and 58. During the operation of focused ultrasonic transducer 30, a voltage is applied across the electrodes, piezoelectric substrate 52 sandwiched between the circular regions of the electrodes 56, 58 vibrates in the thickness direction, generating acoustic waves, which are focused through a planar acoustic Fresnel lens on the top electrode. In a refinement, the applied voltage is an AC voltage (e.g., sinusoidal) of 50 to 450 Vpp. In a further refinement, the applied voltage is an AC voltage of 50 to 450 volt peak to peak. In a further refinement, the applied voltage is an AC voltage having a frequency at or near (e.g., within 10 percent) the resonant frequency. The applied voltage can have a frequency from about 1 to 180 MHz). In another refinement, the applied voltage is applied as a voltage pulse of the AC voltage. In a refinement, the voltage pulse width can be from about 5 to 10,000 us. In another refinement, focused ultrasonic transducer 30 is configured to operate at a plurality of different frequencies, a plurality of different voltage amplitudes, and/or a plurality of different pulsewidths.

Figure 2C:
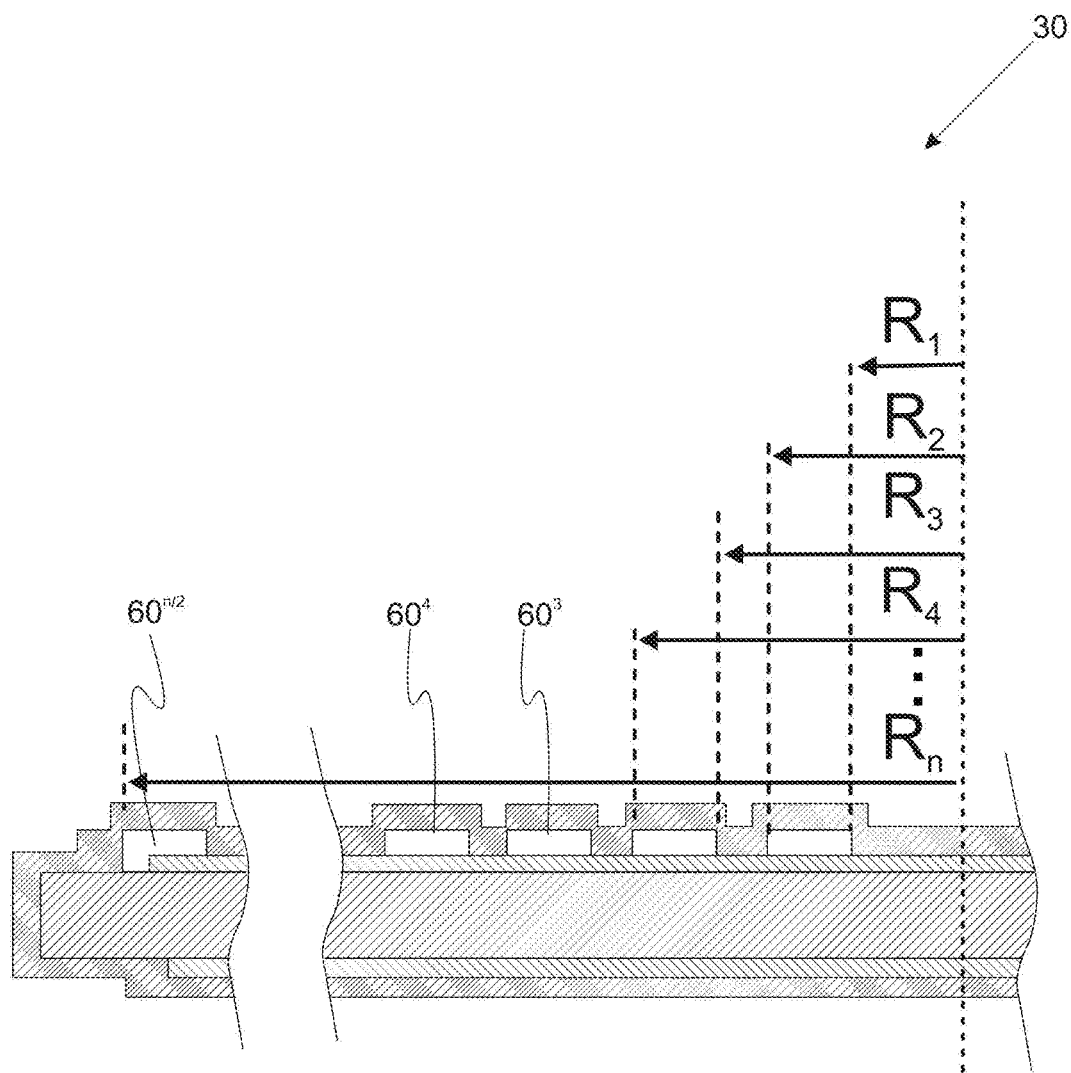
FIG. 2C. Side view of the Self-focusing Acoustic Transducer of FIG. 2A showing the placement of the boundaries for the annular ring air cavities.

Referring to FIG. 2C, to focus ultrasound waves at a focal point at a distance F (focal length) above the center of the transducer's top surface, the annular rings are designed into Fresnel half-wavelength bands (FHWB) [20] so that all the acoustic waves arrive at the focal point with a net phase difference less than 180° after passing through the lens. This is achieved by choosing boundary radii $R_n$ so that the path-length from the focal point to any ring boundary is longer than F by integer multiples of the half-wavelength (λ/2) (see also, FIG. 3A), as shown in the equation below:

$$\sqrt{R_n^2+F^2}-F=n\lambda/2, n=0,1, 2, \quad (1)$$

from which equation 2 can be derived:

$$R_n=\sqrt{n\lambda \times (F+(n\lambda/4))}, n=0,1, 2, \quad (2).$$

where λ and F are the wavelength in medium (water) and the designed focal length, respectively. With respect to the label i, boundary radii for an air cavity ring labeled i are $R_{2i-1}$ and $R_{2i}$, i=1, 2, 3 . . . . With respect to the label j, boundary radii for a non-air-cavity labeled j are $R_{2j-2}$ and $R_{2j-1}$, j=1, 2, 3 . . . , which include the circle in the center (which is essentially a "ring" with zero inner diameter) and every other ring outwards.

Since the droplet size is proportional to the focal diameter [4], [5], [14], [22], [23], to have large droplet size, the Fresnel lens can be designed to have a large focal diameter, which can be approximated by the width of the outermost ring band of the lens [14]. For a Fresnel lens with total N ring boundaries with the outermost ring width being ΔR, if $R_N>>\Delta R$ (which is usually true for N≥5), equation 3 is obtained [14]:

$$\Delta R \cong \sqrt{(cF)/(4Nf)}, \quad (3)$$

where f and c are frequency and sound velocity in medium, respectively. In order to make focal diameter (which can be estimated by ΔR) large, a focused ultrasonic transducer 30 with a long focal length (e.g., greater than 15 mm) can be designed.

Table 1 provides exemplary dimensions for focused ultrasonic transducer 30. It should be that practice for each dimension can be plus/minus 50 percent the values indicated in the table.

TABLE 1

Dimensions of droplet ejector.

| Piezoelectric substrate thickness | Transducer size | Air cavity height | Parylene thickness |
|---|---|---|---|
| 2.0 mm | 36 × 36 mm² | 2.0 mm | 16.0 mm |

Boundary radii of Fresnel rings (inner, outer in mm)

| 1st ring | 2nd ring | 3rd ring | 4th ring | 5th ring |
|---|---|---|---|---|
| 0.00, 5.13 | 7.30, 9.00 | 10.5, 11.8 | 12.9, 14.1 | 15.2, 16.2 |

In another embodiment, a method for selecting and placing semiconductor chips using the SFAT-based liquid ejector device described by FIGS. 1A, 1B, 2A, and 2B is provided. The method includes a step of providing a layer of semiconductor chips 22 disposed over a first surface of a liquid 12. The first surface is a liquid-air and focusing an acoustic wave on the layer of semiconductor chips 22 with a focused ultrasonic transducer 30 such that a droplet including at least one semiconductor chip is ejected through the liquid-air interface per each actuation of the focused ultrasonic transducer 30 through droplet ejection. The details of ejector device 10 and the focused ultrasonic transducer 12 are well as operating conditions are set forth above.

Figure 3A:
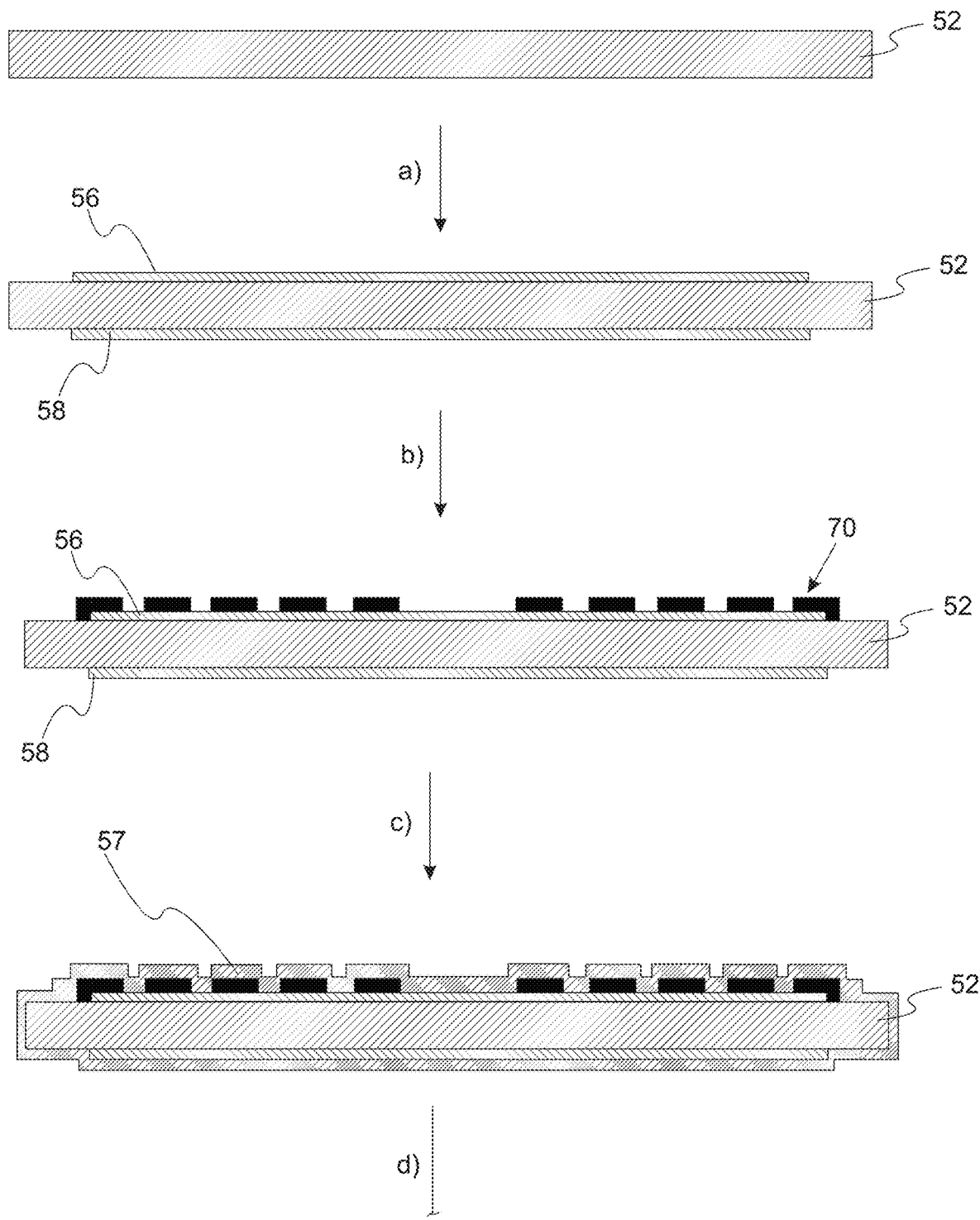
FIGS. 3A and 3B. Schematic flowchart showing the microfabrication of the Self-focusing Acoustic Transducer of FIG. 2A.
Figure 3B:
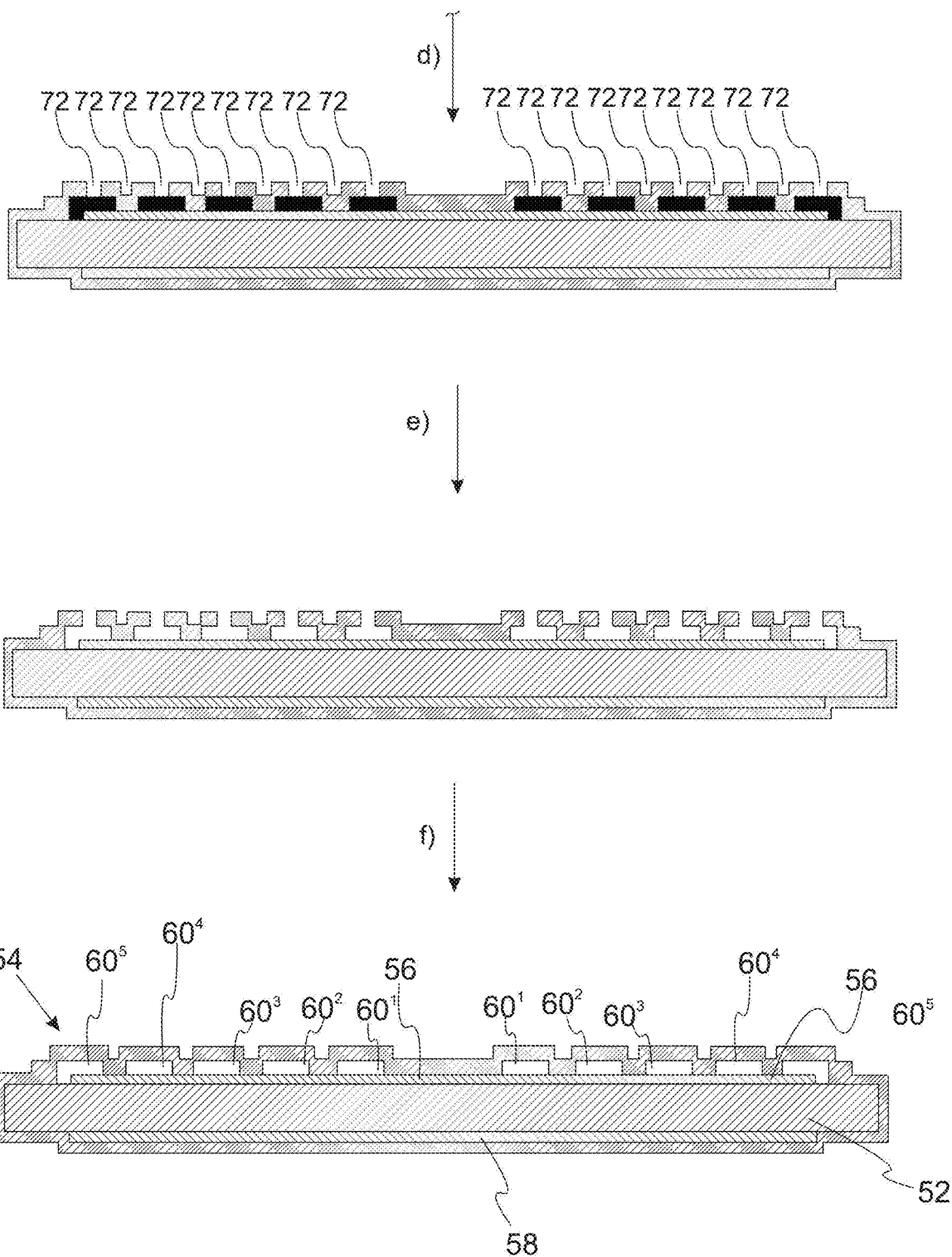

Referring to FIGS. 3A and 3B, a schematic flowchart showing the fabrication of focused ultrasonic transducer 30. In step a, a first patterned metal electrode 56 is deposited over a top face of piezoelectric substrate 52 and a second patterned metal electrode 58 is deposited over a bottom face of piezoelectric substrate 52. In step b), a patterned photoresist layer 70 is deposited (e.g., by spin-coating) and patterned through photolithography over the first metal electrode 56 as a sacrificial layer for air cavity rings. In step c), polymer encapsulant 57 is deposited over the patterned photoresist layer 70 as a structure layer for the air cavities. In a refinement, polymer encapsulant 57 surrounds piezoelectric substrate 52, a first patterned metal electrode 56, a second patterned metal electrode 58, and the patterned photoresist layer 70. In step d), release holes 72 are patterned in polymer encapsulant 57. The release holes can be formed by micromachining. In step e), the patterned photoresist layer 70 is removed by introducing a solvent (e.g., acetone) into the release holes that can dissolve the photoresist. In step f), another layer of the polymer is deposited to seal the air cavities.

The following examples illustrate the various embodiments of the present invention. Those skilled in the art will recognize many variations that are within the spirit of the present invention and scope of the claims.

I. DEVICE DESIGN

Figure 4A:
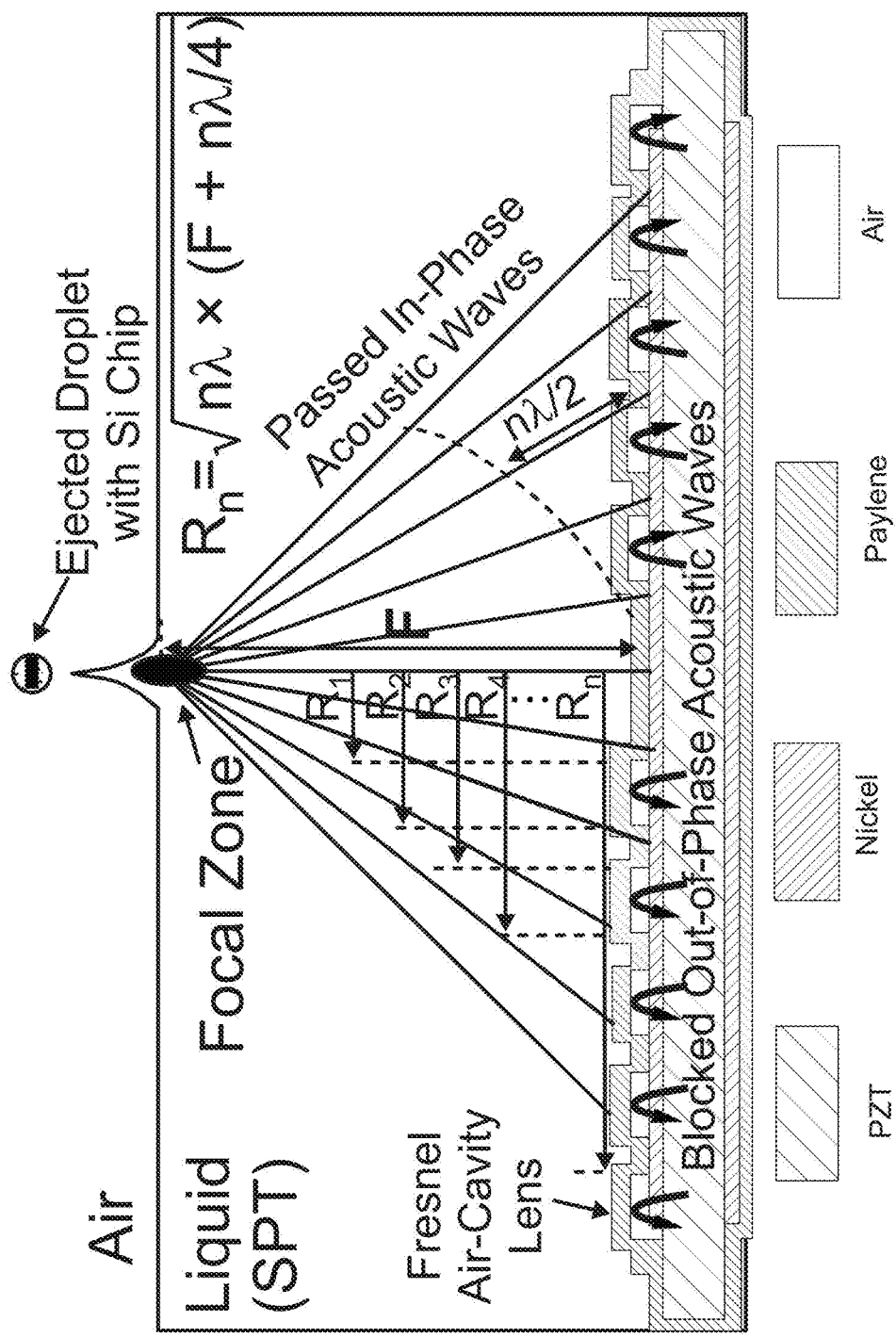
FIGS. 4A and 4B. (A) Schematic showing the cross-section (across the dashed line in (B)) of the droplet/silicon chip ejector to illustrate how the annular-ring air cavity Fresnel lens is designed to focused ultrasound. (B) Top-view photo of the ejector on 2-mm-thick PZT substrate (brown), showing five air-cavity rings (light grey with holes, for blocking out-of-phase waves) alternating with five Parylene-covered electrode regions (dark grey circle and four rings, where In phase waves could pass). The holes on air-cavity ring are release-holes sealed after releasing sacrificial layers to create the air cavities [21].
Figure 4B:
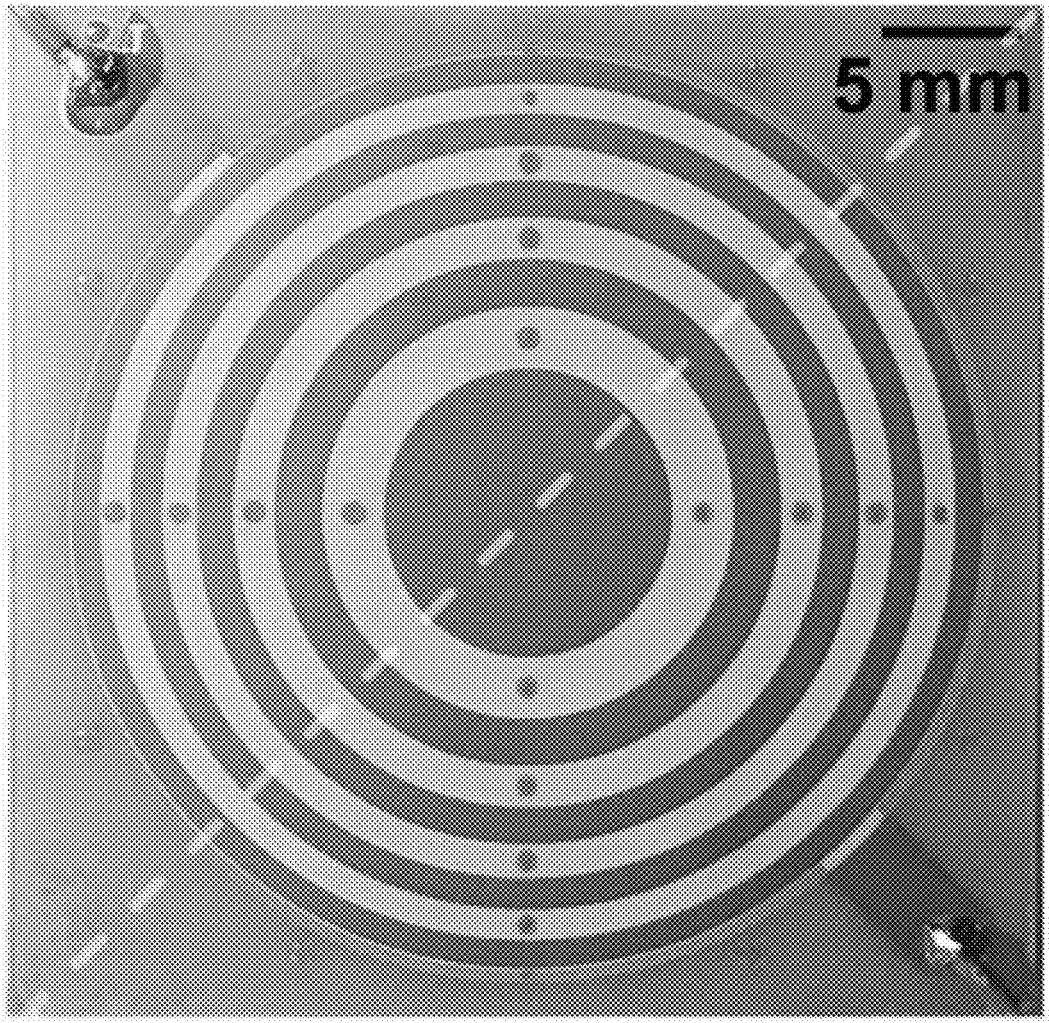

An SFAT is built on a bulk PZT substrate on top of which a nickel electrode is patterned into a circle with two extended rectangular soldering pads (although only one is necessary, the other is added as a backup) for electrical connection (FIG. 4B). At the bottom side of the PZT, a second nickel electrode is patterned into the same shape but with a 90° rotation so that the circular portions of both electrodes coincide, but the soldering pads do not. When a sinusoidal voltage signal is applied across the electrodes through electrical wires soldered on the rectangular pads, the PZT sandwiched between the circular regions of the electrodes vibrates in a thickness direction, generating acoustic waves, which are focused through a planar acoustic Fresnel lens on the top electrode. The Fresnel lens includes Parylene-sealed annular-ring air cavities alternating with non-air-cavity circle and ring areas that are uniformly coated with Parylene (FIGS. 4A and 4B). The acoustic waves are almost completely blocked by the air cavities due to the large acoustic impedance difference between air (0.4 kPa·s/m) and solid (over 1 MPa·s/m), but can propagate through the non-air-cavity areas. To focus ultrasound waves at a focal point at a distance F (focal length) above the center of the transducer's top surface, the annular rings are designed into Fresnel half-wavelength bands (FHWB) [20] so that all the acoustic waves arrive at the focal point with a net phase difference less than 180° after passing through the lens. This is achieved by choosing boundary radii $R_n$ so that the path length from the focal point to any ring boundary is longer than F by integer multiples of the half-wavelength (λ/2) (FIG. 4A), as shown set forth above.

As set forth above, the droplet size is proportional to the focal diameter. According to Equation 3, in order to make the focal diameter (which can be estimated by ΔR) large, an SFAT is designed with a long focal length of 22 mm, low operating frequency of 1.16 MHz, and only five non-air-cavity Fresnel rings (N=9).

To keep silicon chips (having a density of 2.32 g/cm³) afloat on liquid medium, sodium polytungstate (SPT, Geoliquids Inc.) solution is chosen as liquid medium, with its density adjusted to 2.50 g/cm³ by mixing SPT powder with DI water at a weight ratio of 3.386:1, resulting in a sound velocity of 1,372 m/s [24]. Compared to other types of heavy liquids such as halogenated hydrocarbons, SPT solution is non-toxic, easy to make (water-soluble), and chemically inert to common materials used on semiconductor chips.

II. SIMULATION

A. Simulation of Acoustic Pressure and Body Force

Figure 5A:
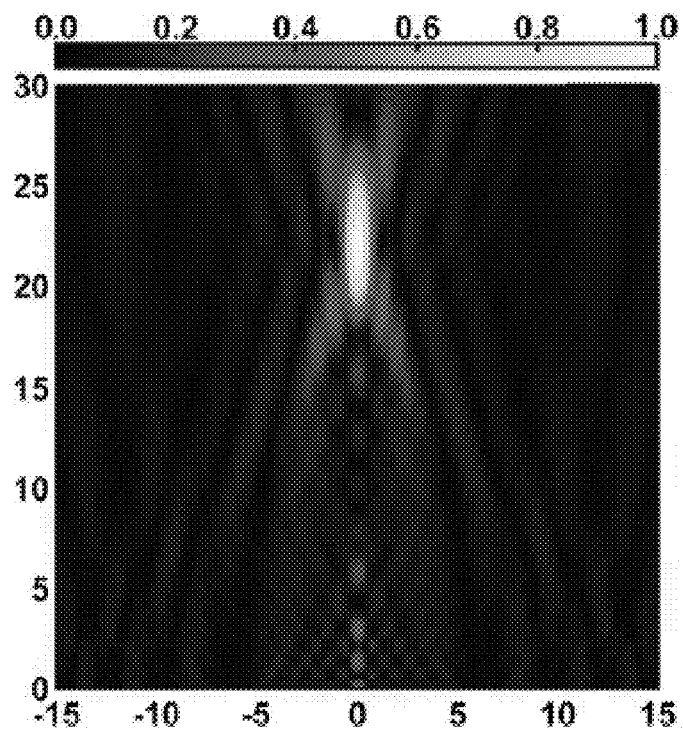
FIGS. 5A, 5B, 5C, 5D, 5E, and 5F. Simulated relative acoustic pressure distribution ignoring reflection from the SPT-air interface: (A) over the central vertical plane, (B) over focal plane at $Z=22$ mm. Hydrophone measurement of acoustic pressure in SPT solution (C) along the central vertical axis and (D) along the central lateral axis on the focal plane, with 85 Vpp applied on the ejector. (E) Simulated acoustic pressure (color-bar unit: MPa) over a central vertical plane with acoustic reflection from the SPT-air interface (20.04 mm above the device's top surface), with 400 Vpp applied to the transducer (pressure values normalized from measurement data in (D) and (E)). (G) Magnitude (color-bar unit: $\times 10^6$ N/m$^3$) and direction (white arrows) of the acoustic-field-induced body force near the SPT-air interface, calculated from the pressure distribution in (F).
Figure 5B:
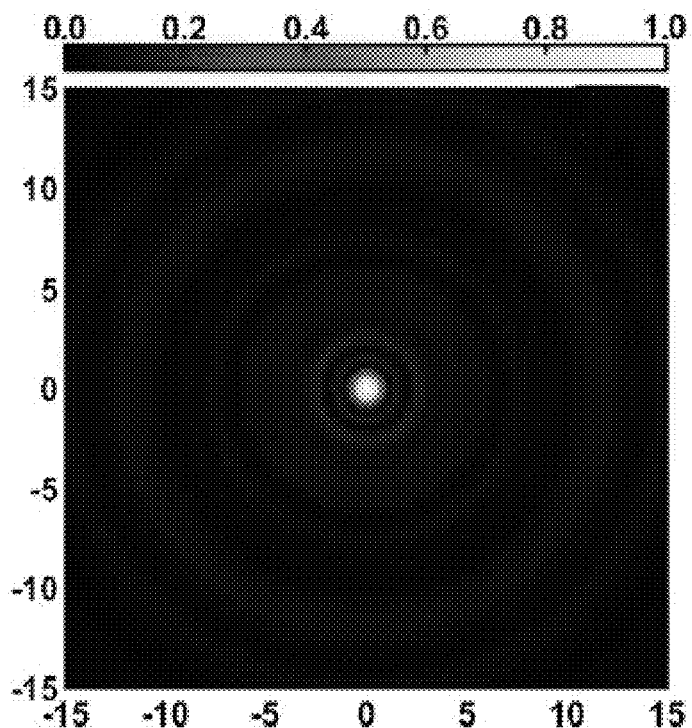
Figure 5C:
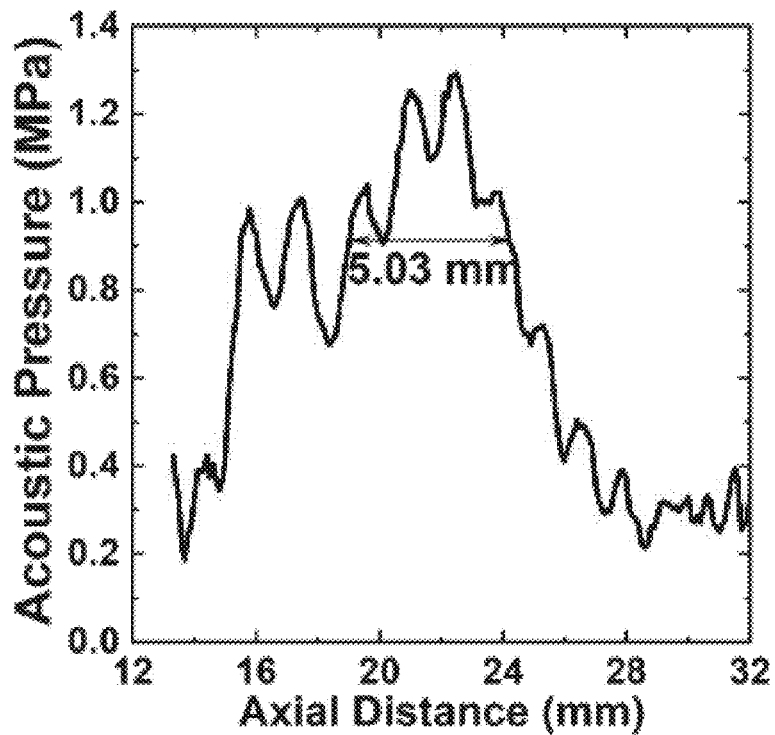
Figure 5D:
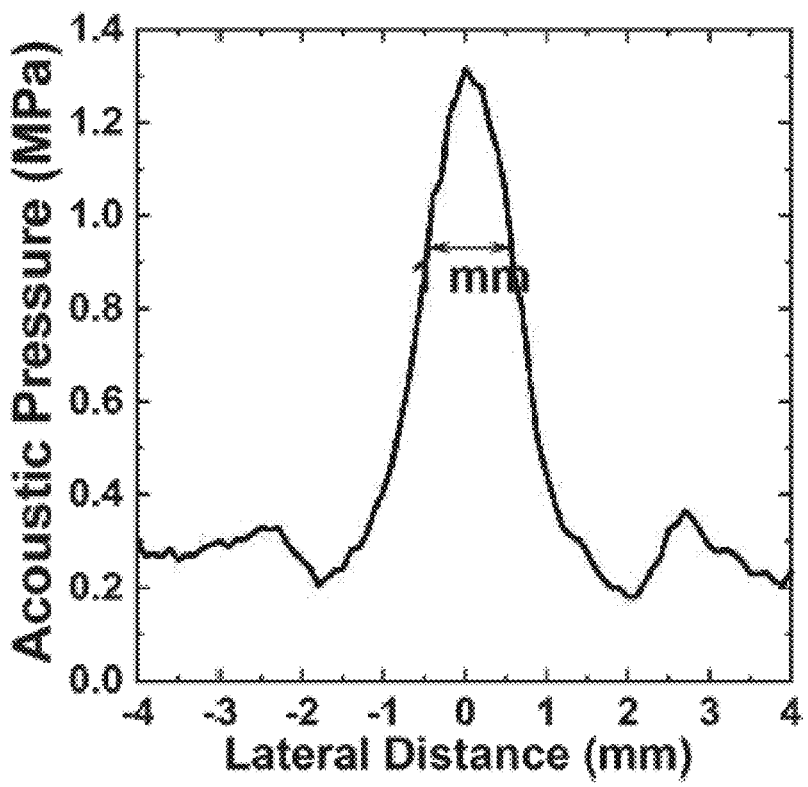
Figure 5E:
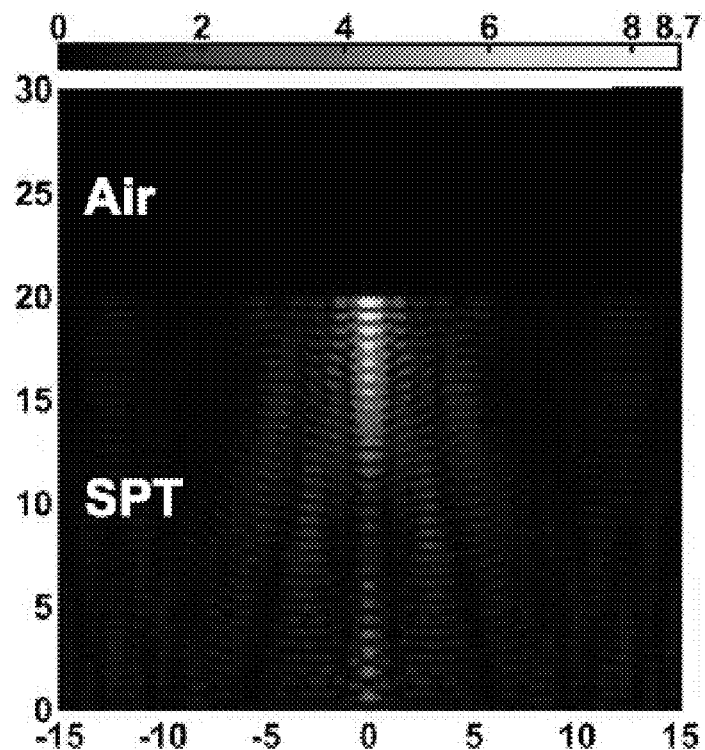

Without reflection from SPT solution's top surface, acoustic simulations in the frequency domain at 1.16 MHz show that the focal length is at the targeted 22 mm, while focal depth and diameter are 5 mm (FIG. 5A) and 1 mm (FIG. 5B), respectively. The large focal depth is desirable, because it tolerates the liquid level change during ejection. These results are confirmed with hydrophone measurement of acoustic pressure. With an SFAT immersed in SPT solution driven with 1.16 MHz sinusoidal pulsed signals, a hydrophone (HGL-0085, Onda Corp.) is scanned along the central vertical axis (FIG. 5C) and along the central lateral axis at the focal plane (FIG. 5D) to measure pressure distribution, with liquid's top surface well above the scan path to minimize reflection. The measured focal length, focal depth and focal size are 21.7, 5.03, and 1.0 mm, respectively, close to the simulated values. With 85 Vpp applied, the peak pressure at the focal point is measured to be 1.29 MPa. In the actual case, acoustic reflection from the SPT's top surface needs to be considered. By comparing models with different liquid heights in simulation, it is found that when the liquid level is 20.04 mm above the transducer, focal zones with very high pressure appear near the SPT-air interface. Through normalizing the simulated pressure value with hydrophone measurement data (assuming the peak pressure is proportional to the applied voltage), the peak pressure near the SPT's top surface is 8.71 MPa, when 400 Vpp is applied on the transducer (FIG. 5E).

Figure 5F:
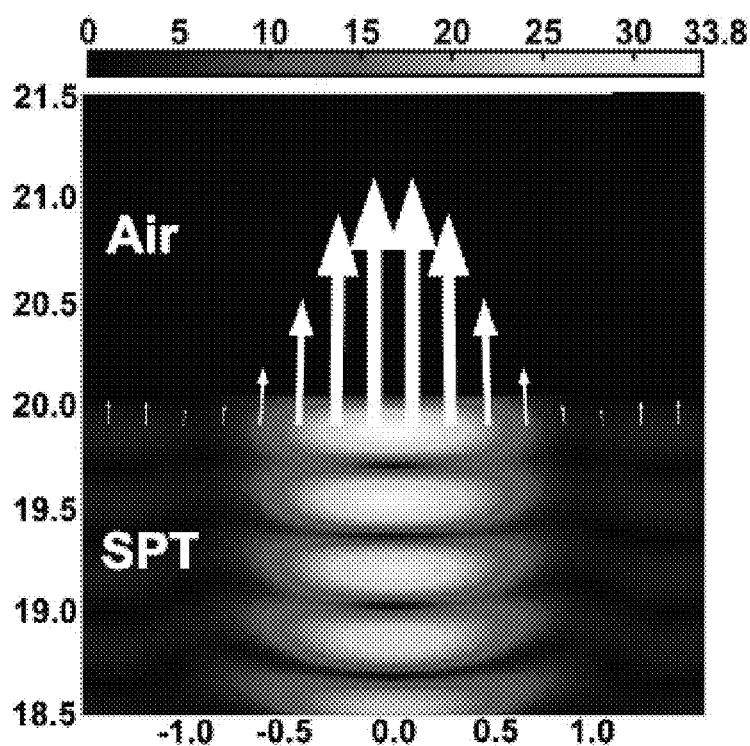
Figure 6A:
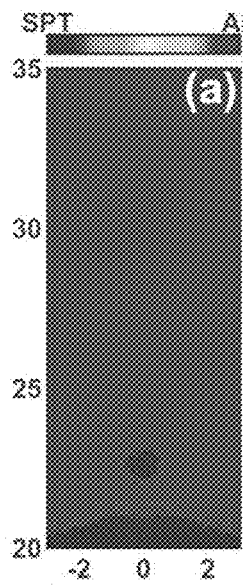
FIGS. 6A, 6B, 6C, 6D, 6E, 6F, 6G, and 6H. Simulation snapshots of ejected droplets with 400 Vpp applied on the transducer with driving pulse width of (A) 517 μs, (B) 862 μs, (C) 1,724 μs and (D) 2,586 μs. Simulation snapshots of ejected droplets with 1,724 μs driving pulse width and driving voltage of (E) 310 Vpp, (F) 340 Vpp, (G) 370 Vpp, and (H) 430 Vpp.
Figure 6B:
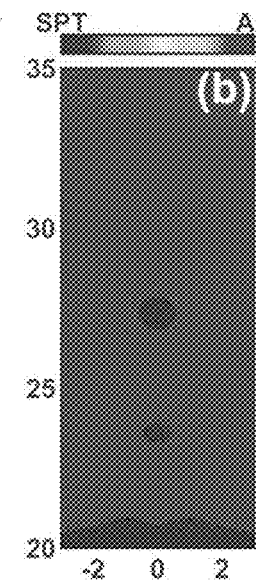
Figure 6C:
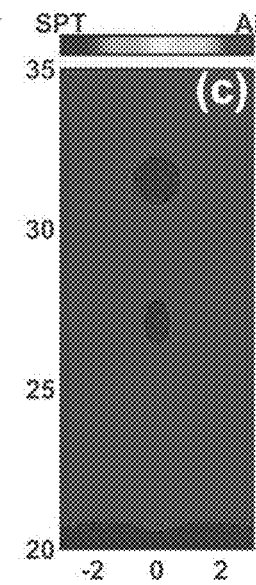
Figure 6D:
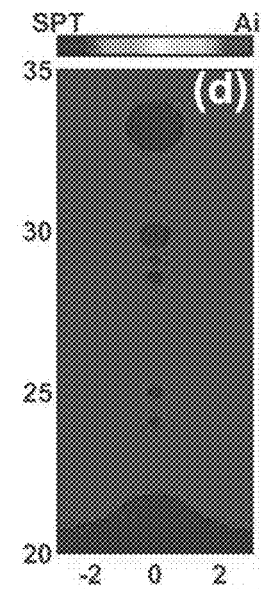
Figure 6E:
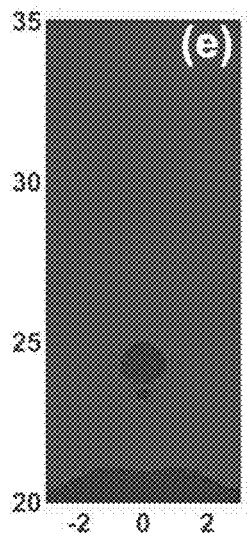
Figure 6F:
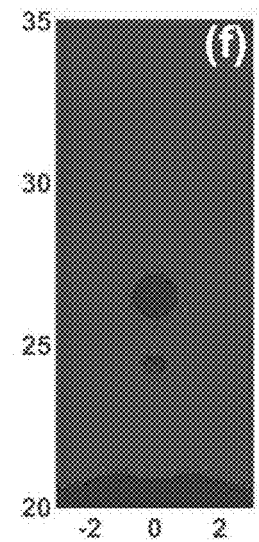
Figure 6G:
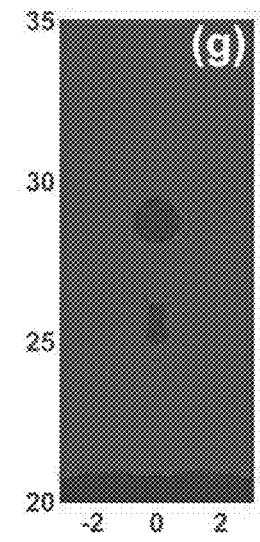
Figure 6H:
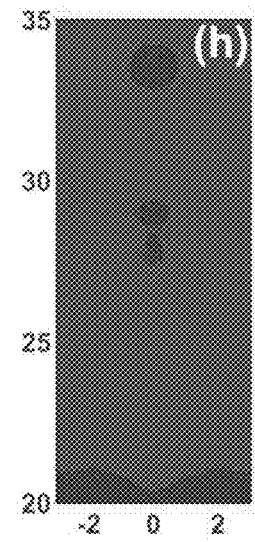

From Nyborg's analysis of Navier-Stokes equation of fluid mechanics and the continuity equation using the method of successive approximations [25], the magnitude and direction of the acoustic-field-induced steady body force near the SPT-air interface are evaluated (FIG. 5F), in which it is clearly observed that a strong force pointing from the center of the focal zone closest to SPT's top surface into the air, and the peak force magnitude is as high as $3.38 \times 10^7$ $N/m^3$.

B. Simulation of the Droplet Ejection Process

Figure 7:
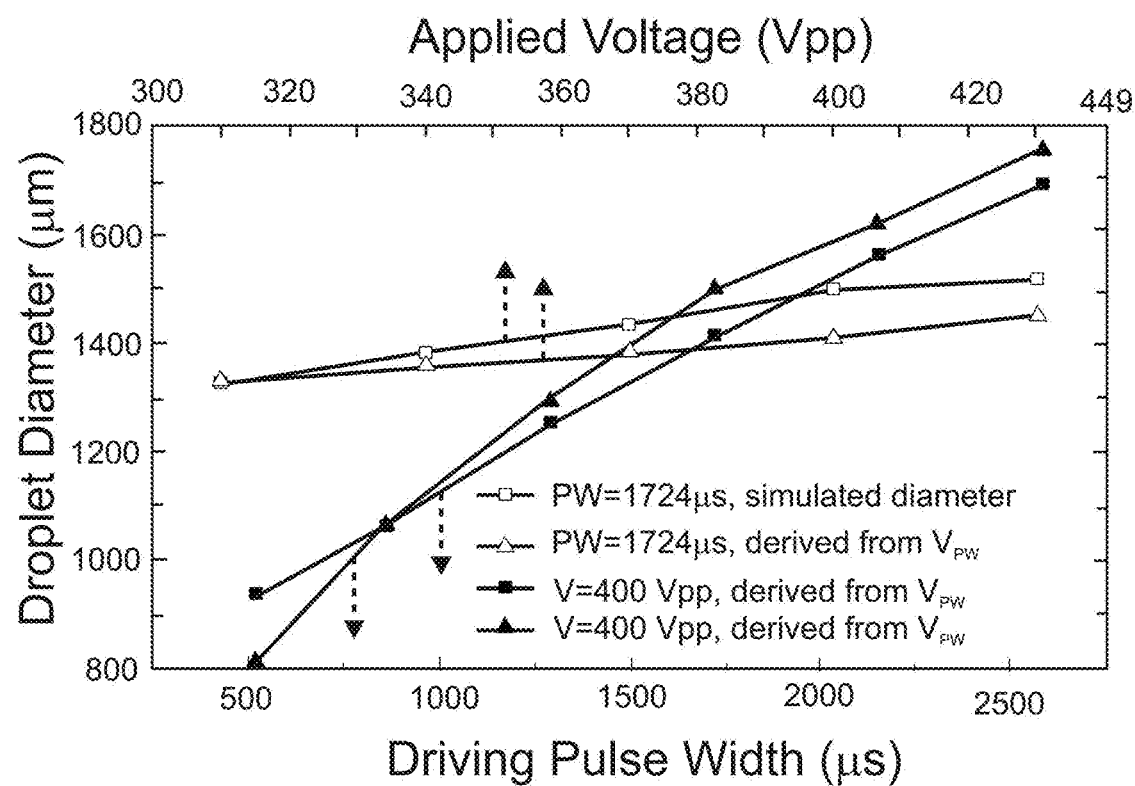
FIG. 7. Simulated main droplet diameter and the equivalent diameter calculated from VPW (bulging water column volume when the acoustic signal is turned off) versus driving pulse width (with 400 Vpp applied) and driving voltage (with 1,724 μs pulse width).

The acoustic ejection processes are first simulated with the same 400 $V_{pp}$ applied on the transducer but with driving pulse width from 517 to 2,586 µs (FIG. 6A to 6D). In all four cases, droplets are ejected by the focused ultrasound (with satellite droplets generated in the latter three cases), and the simulated diameter of the main droplets increases with the driving pulse width, ranging from 932.6 to 1690.5 µm (FIG. 7). Similarly, the driving pulse width is kept at 1,724 µs, while varying the driving voltage from 310 to 430 $V_{pp}$. In this case, the droplet size also increases with applied voltage (ranging from 1327.3 to 1451.5 µm, as shown in FIGS. 6C, 6E to 6H), but the increase is small compared to the case with an increased pulse width (FIG. 7). These results suggest a new and simple way of controlling the droplet size through tuning the driving conditions, especially the pulse width.

With long pulse widths (and high driving voltages), the ejection process is less stable [26]. As a result, satellite droplets are generated, and the ejection direction is less repeatable. However, in the application described herein, the former concern is not an issue as long as the main droplet can carry a semiconductor chip, and the latter problem can be minimized as discussed in the next section.

III. EXPERIMENTAL RESULTS

A. Characterization of Droplet Diameter

Figures 8A, 8B, 8C, 8D, 8E, 8F, 8G, 8H, 8I:
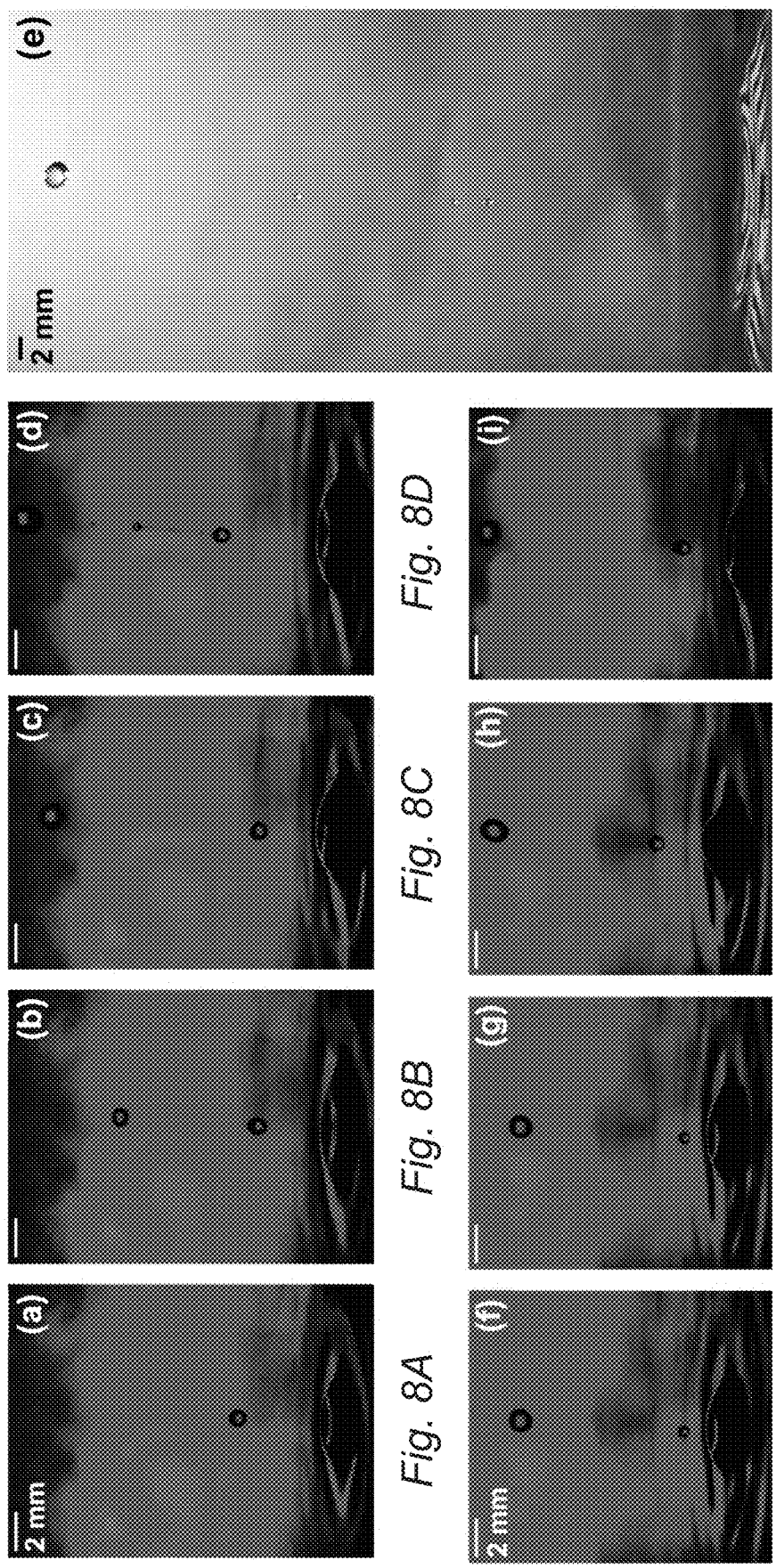
FIGS. 8A, 8B, 8C, 8D, 8E, 8F, 8G, 8H, and 8I. Photos of the ejected droplets with 394 Vpp applied on the transducer with a driving pulse width of (A) 517 μs, (B) 862 μs, (C) 1,724 μs, (D) 2,586 μs and (E) 6,034 μs. Photos of the ejected droplets with 1,724 μs driving pulse width and driving voltage of (F) 283 Vpp, (G) 312 Vpp, (H) 339 Vpp, and (I) 368 Vpp. Scale bar length is 2 mm in all photos. All photos are taken with optical strobing, except that (E) is taken with a high-speed camera.
Figure 9:
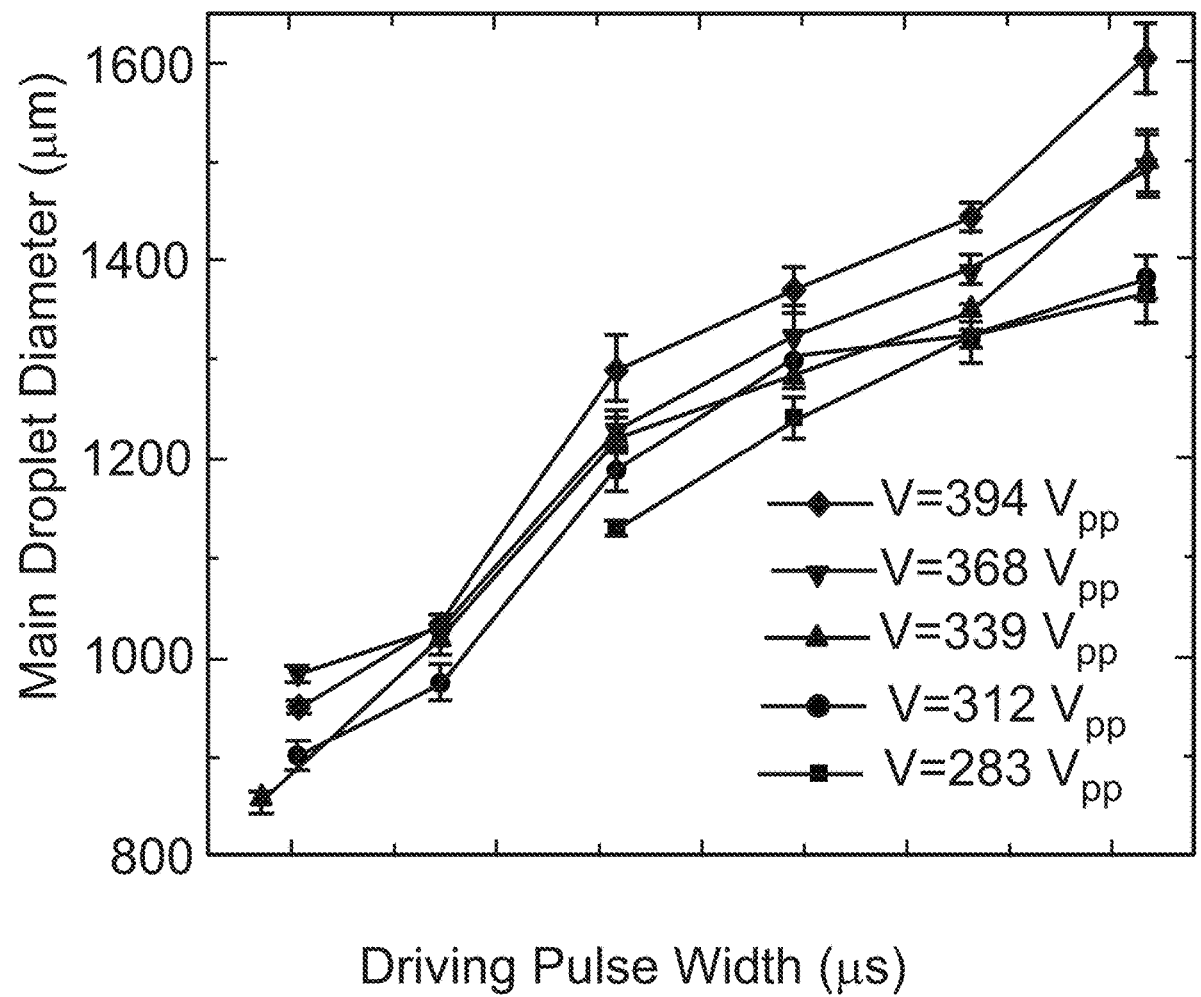
FIG. 9. Graph showing measured main droplet diameter with different driving voltages and driving pulse widths.

The SFAT is microfabricated according to the steps described in [21]. During droplet ejection experiments, a 1.16 MHz pulsed sinusoidal voltage signal from a function generator (AFG3252, Tektronix, Inc.) is amplified by a power amplifier (75A250, Amplifier Research Corp.), and is delivered to the SFAT, which is placed at the bottom of a plastic container filled with SPT solution. The liquid level is adjusted until the ejected droplets can fly to the highest level before falling down due to gravity, and turn out to be around 20 mm, as predicted by the simulation in FIG. 5G. With the driving condition of 394 Vpp and 2 Hz pulse repetition frequency (PRF) while varying the driving pulse width from 517 to 2,586 µs, stroboscopic snapshots are taken of the droplet ejection process (FIGS. 8A to 8D) with a long-range microscope lens (Zoom 6000, Navitar Inc.) attached to a digital camera (STC-MCCM401U3V, Sentech Co., Ltd.) which is connected to a computer to save the photos. The background during droplet ejection is illuminated by a strobing LED light source flickering at the same 2 Hz frequency with some delay after the onset of the driving voltage pulse. The droplet ejections are stable and repeatable as photos (with frame height of 15.5 mm) taken at different times during the ejection look almost identical, and the main droplet size increases with longer pulse width, ranging from 950 to 1,604 µm, which are close to the simulation results. With much longer pulse width of 6,034 µs, the ejection process is recorded with a high-speed camera (DSC-RX100M6, Sony Corp.) at 960 frames per second, since the ejection is less stable so that no clear image may be captured with the strobing method, and the main droplet diameter is observed to be 2,490 µm (FIG. 8E). Similarly, the driving voltage from 283 to 368 Vpp is varied, and the pulse width in each case is changed to measure the diameter of the ejected main droplets. In the case where the pulse width is 1,724 µs, the main droplet diameter varies from 1241.4 to 1370.2 µm, as the driving voltage changes from 268 to 394 Vpp (FIGS. 8F to 8I, and 8C). All the measurement results (FIG. 9) show that higher driving voltage and longer pulse width indeed increase the droplet size, with the pulse width having more effect on the droplet size than the voltage, especially at lower driving voltages, agreeing with simulation results in FIG. 7.

B. Ejection of Silicon Chips

Figure 10A:
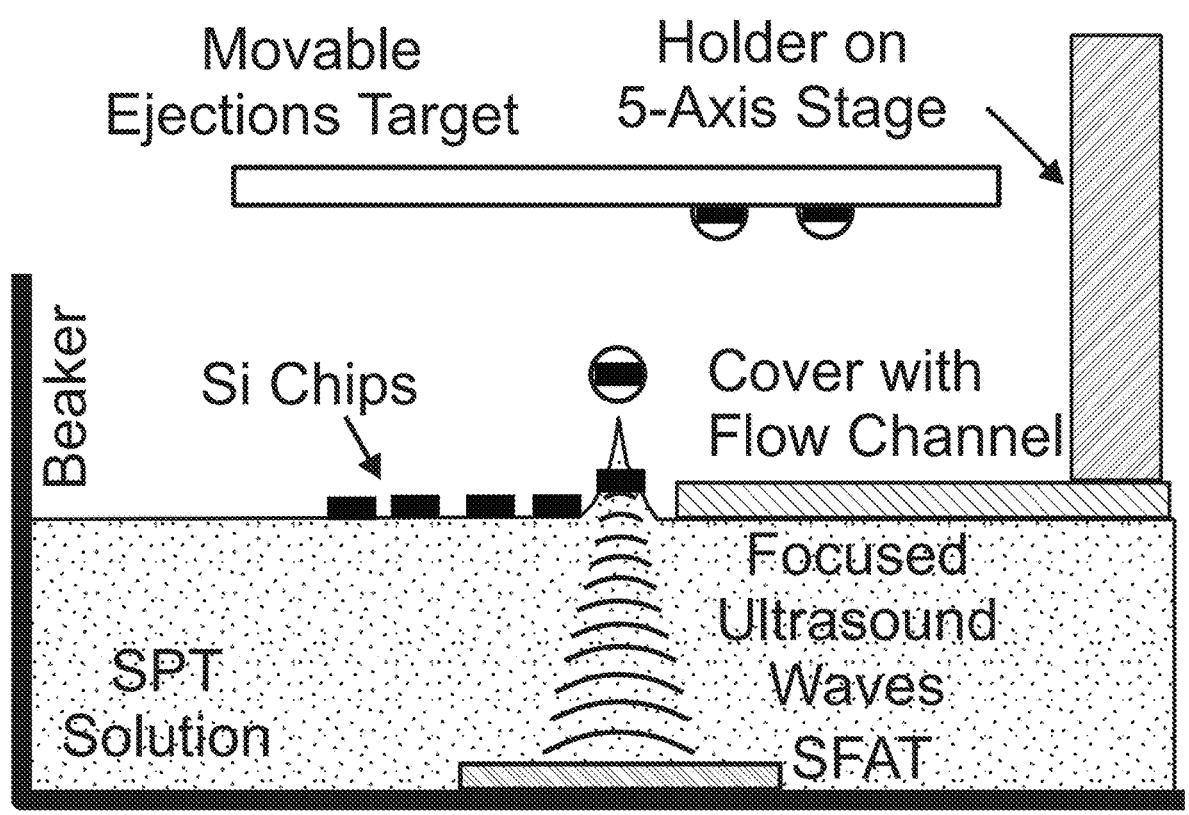
FIGS. 10A, 10B, 10C, 10D, and 10E. (A) Cross-sectional diagram (across the center line along the channel on the cover) of the ejection setup. (B) Top-view photo of a laser-machined channel-embedded plastic cover (designed for chips with 1,600 μm side length) held by an acrylic holder, aligned to the ejector at the container bottom, with silicon chips floating in the channel. Photos of ejected droplets of different sizes carrying 0.4-mm-thick silicon chips having side lengths of (C) 700 μm, (D) 1,600 μm (with a satellite droplet), and (E) 3,100 μm (with satellite droplets).
Figure 10B:
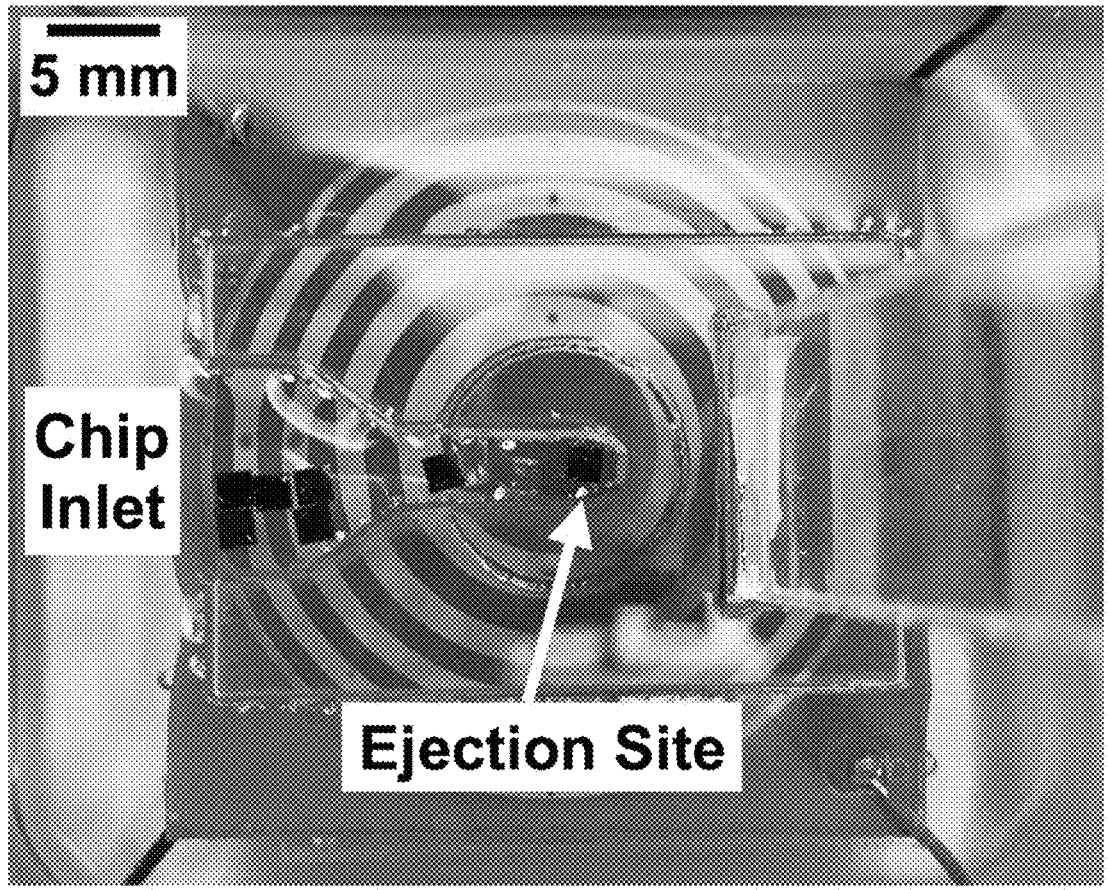
Figures 10C, 10D, 10E:
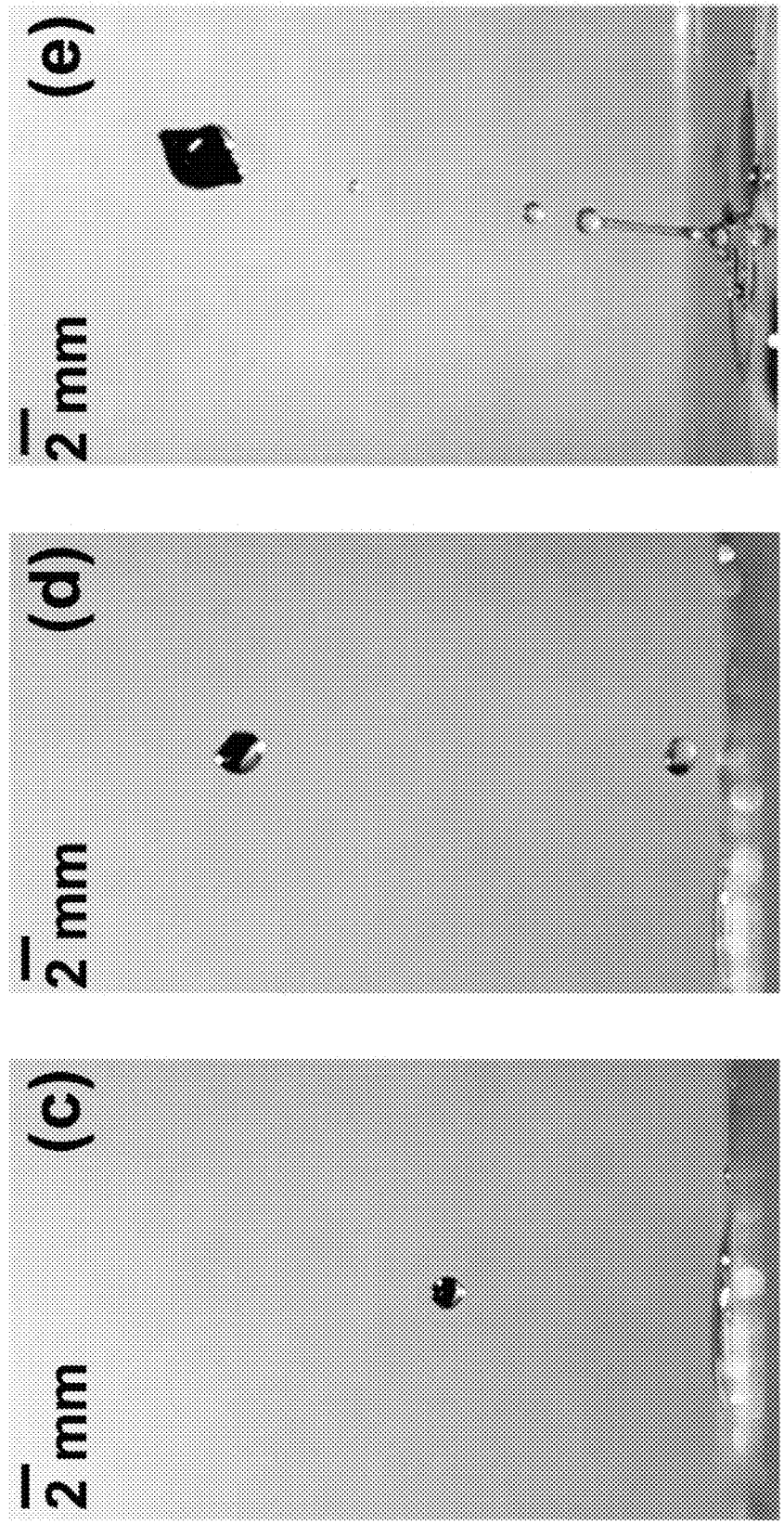

A setup for chip ejection is built based on the ejector (FIG. 10A). To simulate semiconductor chips, 400-µm-thick silicon-nitride-covered silicon wafers are diced into square pieces with a dicing saw. To guide silicon chips floating on the liquid surface to the ejection site, a 500-µm-thick polyester cover is laser-machined to create a flow channel and an engraved circle to align the cover to the center Fresnel circle of the ejector (FIG. 10B). The cover is held at the liquid surface (adjusted to around 20 mm), by a laser-machined acrylic holder fixed on a 5-axis precision stage, which allows fine-tuning of the liquid level held by surface tension between liquid and the cover as well as the alignment between the cover and the transducer. The surface tension also helps to maintain liquid height during ejection, in spite of some loss of liquid in the container from the ejection. When silicon chips are dumped onto the SPT solution (whose high density keeps them afloat) near the inlet of the cover, the chips are automatically loaded onto the ejection site, as the chips are ejected one by one through operating the droplet ejector in two modes described in the next subsection. With 394 Vpp applied to the ejector, droplets of different sizes to carry square silicon chips having side lengths of 700, 1600 and 3100 μm (FIGS. 10C to 10E), using pulse widths of 1293, 3017, and 6034 μs, respectively, are successfully ejected.

C. Automatic Loading of Silicon Chips

Figure 11A:
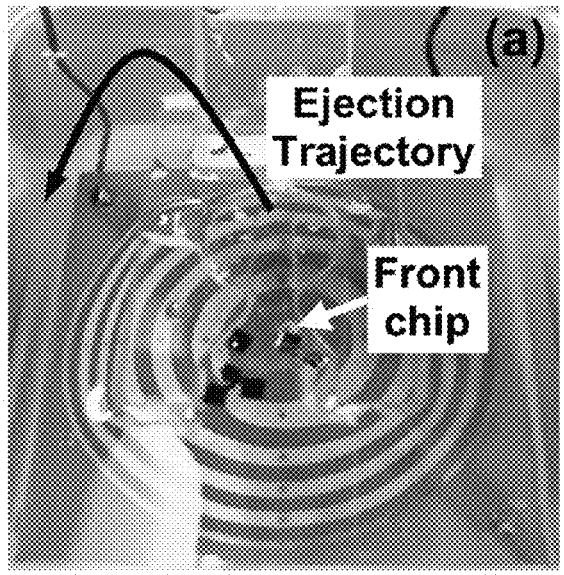
FIGS. 11A, 11B, 11C, 11D, 11E, and 11F. Photos showing the semi-automatic chip loading mechanism: (A) chips are dumped into the inlet of the flow channel, also showing the ejection trajectory of liquid droplets under a weak ejection; (B) chips moving in along the channel as an ejected liquid droplet flies in air; (C) chips moving in further; (D) front chip loaded at the ejection site after seven ejections. Photos of 400-μm-thick square silicon chips with side length of (E) 700 μm and (F) 1,600 μm ejected into 4×3 arrays with an interval of 5 mm collected on filter paper, with red crosses showing the centers of ejected chips in five other repeated trials with the center of the left top chip aligned together.
Figure 11B:
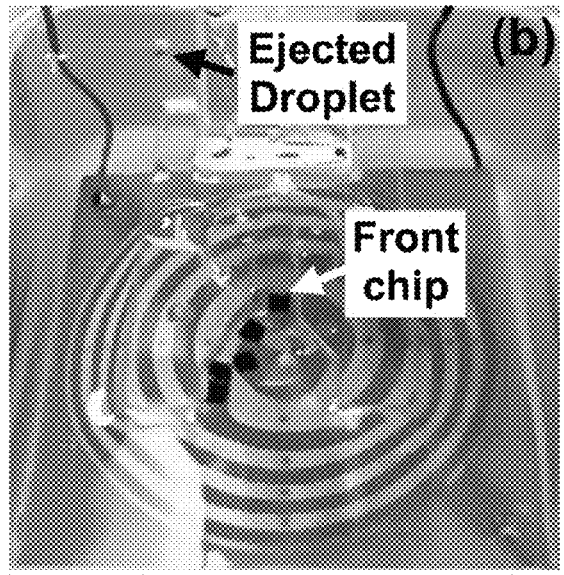
Figure 11C:
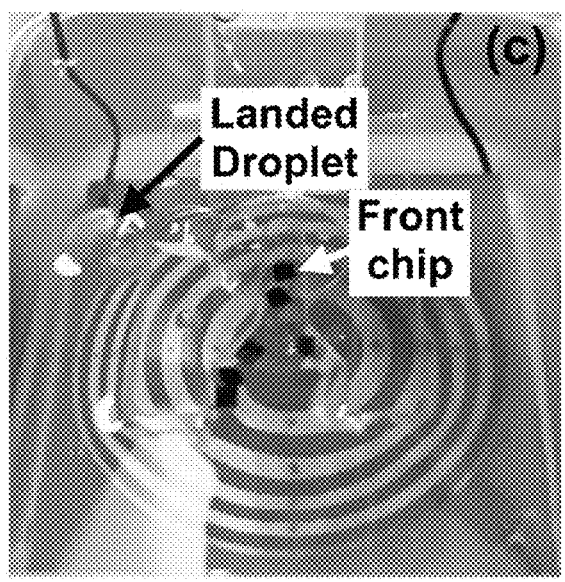
Figure 11D:
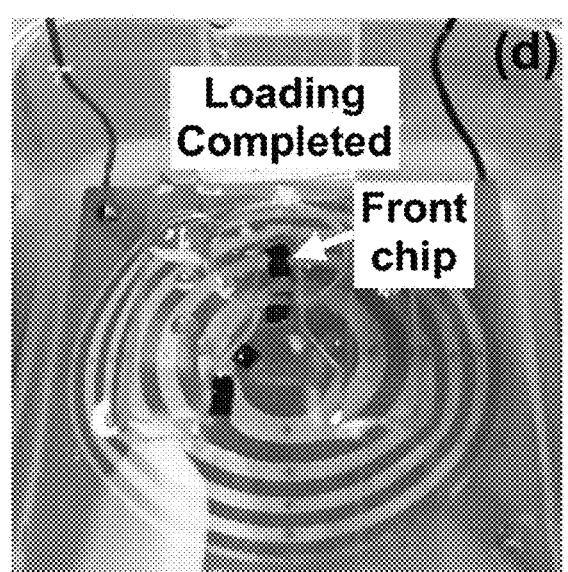

The chips loaded into the inlet of the embedded flow channel on the cover can be drawn to the ejection site automatically through an operating mode of weak droplet ejection. When the device is driven with 1,724 μs pulse width, 10 Hz PRF and around 200 Vpp voltage (about half of the typical ejection voltage), due to the long pulse width and the cover not being perfectly parallel to the ejector, droplets are ejected to the side of the cover from the ejection site (FIGS. 11A to 11C). The voltage is adjusted so that the droplet does not fly too high, but flies just out of the cover, so that the total liquid level remains constant. As a result, the temporarily reduced liquid level in the local area in the flow channel draws the silicon chips to the end of the channel, which is the ejection site (FIG. 11D), with the silicon chips lined up along the relatively narrow channel. When a silicon chip is in place, the loading stops automatically since the chip blocks the weak ejection. Then the driving condition is changed to the one for the regular ejection (the only manual task at this point, which can be automated), and we can keep ejecting the chips lined up in the channel until loading is needed. This process of loading and ejection can be achieved with a computer interfaced to a function generator with pre-stored conditions.

Figure 11E:
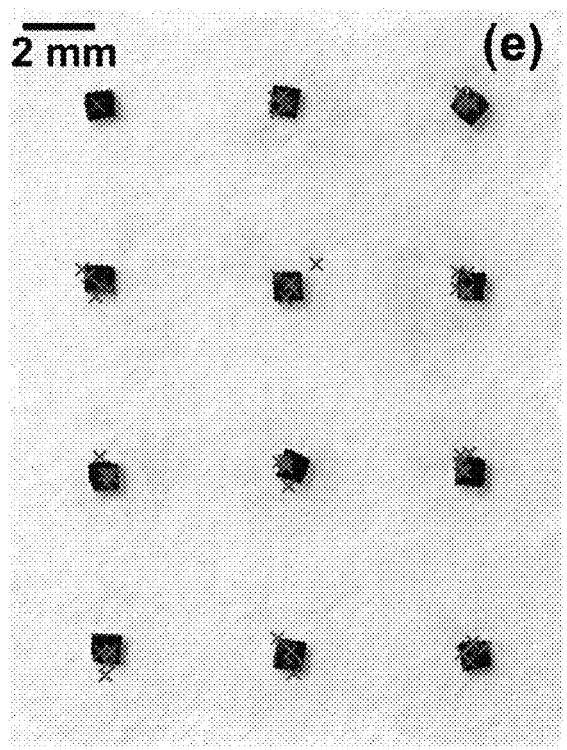
Figure 11F:
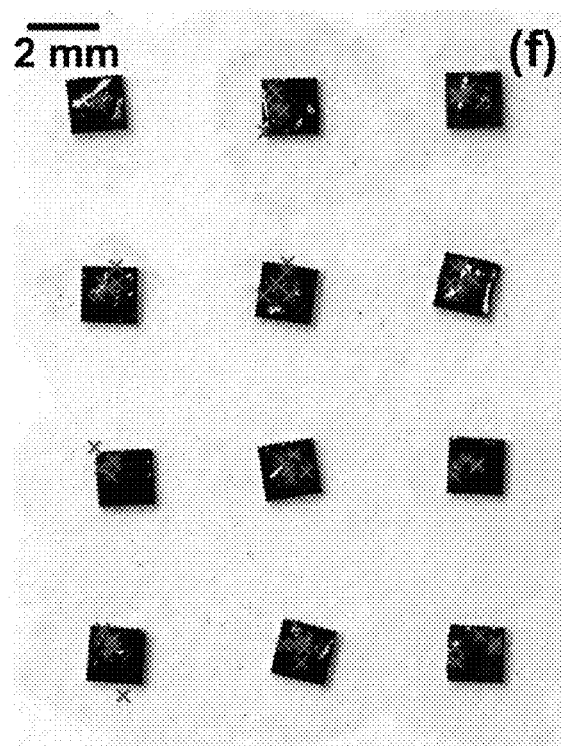

As a demonstration, a piece of filter paper is held above the liquid surface with a second movable stage which is manually moved laterally at an interval of 5 mm after each ejection to collect the ejected chips. Once hitting the filter paper, the chip is held onto the paper by the surface tension of the SPT and is "glued" in place after the water evaporates from the liquid. With a relatively large chip, the ejection is less repeatable. To ensure good positioning precision and alignment, the distance between the liquid surface and filter paper is kept short so that the chip positioning error caused by variation in ejection direction is minimized. However, if the distance is too short, sometimes the ejected chip (flying up at high speed) is reflected back after hitting the paper. Thus, a 4 mm distance is found to be a good compromise. In addition, since shorter driving pulse width improves ejection stability and thus repeatability, pulse widths are kept as low as possible, to 1,293 and 2,069 μs for the 700 and 1,600 μm chips, respectively. Moreover, to reduce chip rotation after ejection and to ensure repeatable ejection direction, good alignment between the chip center and the ejection site is crucial. For this, the opening width of the guiding channel near the ejection site is designed to be close to the side length of the chip and the position of the channel-embedded cover is carefully adjusted. Before each ejection, it is ensured that there is always a second chip right behind the loaded chip in the channel to prevent the loaded chip from going back. With these measures, silicon chips with side length of 700 μm (FIG. 11E) and 1,600 μm (FIG. 11F) into 4×3 arrays with the same interval were successfully ejected. Five other trial sets indicate that the repeatability is good, as shown by x marks for the landing locations.

IV. SUMMARY

Aspects of the invention provide a micromachined acoustic droplet ejector based on a focusing ultrasonic transducer with Fresnel air-cavity lens. With small footprint and two-wire electrical interface, the transducer is capable of generating high-intensity focused ultrasound with 1-mm focal size, which can eject large liquid droplets with diameter from 850 to 2,490 μm, controlled by the driving pulse width and voltage, with the former having more tuning effect than the latter. An FEM simulation model calculating the time evolution of the acoustic-field-induced liquid motion during droplet ejection is developed, and is confirmed with experiments.

With the transducer, a proof-of-concept semiconductor chip pick-and-place system has successfully been demonstrated to eject 400-μm-thick square silicon chips with side length ranging from 700 to 3,100 μm, carried by SPT droplets of different sizes. As ejected droplets generate lateral liquid flow towards the ejection site, the chips are automatically loaded through a microchannel-embedded plastic cover, and can be ejected one after another into arrays with good repeatability.

The experiments demonstrate that a droplet-ejector-based system that is much smaller and cheaper than the conventional approach with robotic arms can be a new possible tool for on-demand semiconductor chip pick and placement. With easily adjustable focal size [14] and tunable droplet diameter, ejector-based pick-and-place systems are able to handle very small chips that robotic arms cannot handle reliably. In addition, since the transducer can be massively microfabricated, a similar system can potentially have massively parallel processing capability with an array of ejectors.

A simple and small system based on the designed SFAT-based droplet ejector, which achieves a focal size as large as 1 mm, and can eject droplets to carry silicon chips floating on liquid surface is described. A new and easy way to control the droplet size through changing the driving pulse width and voltage is also demonstrated, which can vary the droplet diameter for transferring chips of various sizes. Moreover, a channel-embedded plastic cover is designed to load silicon chips automatically onto the ejection site by the local fluid flow generated during droplet dejection.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

REFERENCES

[1] I. O. Yilmaz, "SMT placement machines," in *Development and Evaluation of Setup Strategies in Printed Circuit Board Assembly*. Wiesbaden, Germany: Gabler, 2008, ch. 3, pp. 15-30.

[2] Z. Shook. *SMT Preventive Maintenance: Stop 5 Major Problems With Pick-and-Place Nozzles*. IConnect007.com. Accessed: Sep. 29, 2020. [Online]. Available: http://smt.iconnect007.com/index.php/article/52613/smt-preventive-maintenance-stop-5-majorproblems-with-pick-and-place-nozzles/52616/

[3] R. W. Wood and A. L. Loomis, "The physical and biological effects of high-frequency sound-waves of great intensity," *Philos. Mag. J. Sci.*, vol. 4, no. 22, pp. 417-436, 1927.

[4] S. A. Elrod et al., "Nozzleless droplet formation with focused acoustic beams," *J. Appl. Phys.*, vol. 65, no. 9, pp. 3441-3447, May 1989.
[5] T. Hamazaki and N. Morita, "Ejection characteristics and drop modulation of acoustic inkjet printing using fresnel lens," *J. Fluid Sci. Technol.*, vol. 4, no. 1, pp. 25-36, 2009.
[6] U. Demirci, "Acoustic picoliter droplets for emerging applications in semiconductor industry and biotechnology," *J. Microelectromech. Syst.*, vol. 15, no. 4, pp. 957-966, August 2006.
[7] B. Hadimioglu, S. Elrod, and R. Sprague, "Acoustic ink printing: An application of ultrasonics for photographic quality printing at high speed," in *Proc. IEEE Int. Ultrason. Symp.*, October 2001, pp. 627-635.
[8] D. A. Horine, "Acoustic metal jet fabrication using an inert gas," U.S. Pat. No. 6,007,183 A, Nov. 25, 1997.
[9] E. K. Sackmann et al., "Technologies that enable accurate and precise nano-to milliliter-scale liquid dispensing of aqueous reagents using acoustic droplet ejection," *J. Lab. Autom.*, vol. 21, no. 1, pp. 166-177, February 2016.
[10] B. Colin, B. Deprez, and C. Couturier, "High-throughput DNA plasmid transfection using acoustic droplet ejection technology," SLAS Discovery, *Advancing Sci. Drug Discovery*, vol. 24, no. 4, pp. 492-500, April 2019.
[11] U. Demirci and G. Montesano, "Cell encapsulating droplet vitrification," *Lab Chip*, vol. 7, no. 11, pp. 1428-1433, 2007.
[12] Y. Fang et al., "Rapid generation of multiplexed cell cocultures using acoustic droplet ejection followed by aqueous two-phase exclusion patterning," *Tissue Eng. C, Methods*, vol. 18, no. 9, pp. 647-657, September 2012.
[13] B. Hadimioglu, R. Stearns, and R. Ellson, "Moving liquids with sound: The physics of acoustic droplet ejection for robust laboratory automation in life sciences," *J. Lab. Autom.*, vol. 21, no. 1, pp. 4-18, February 2016.
[14] Y. Tang and E. S. Kim, "Acoustic droplet-assisted particle ejection through and from agarose-gel-filled Petri dish," in *Proc. IEEE Int. Ultrason. Symp.*, October 2019, pp. 64-67.
[15] J. W. Kwon, S. Kamal-Bahl, and E. S. Kim, "In situ DNA synthesis on glass substrate for microarray fabrication using self-focusing acoustic transducer," *IEEE Trans. Autom. Sci. Eng.*, vol. 3, no. 2, pp. 152-158, April 2006.
[16] Y. Choe, S.-J. Chen, and E. S. Kim, "Peptide synthesis on glass substrate using acoustic droplet ejector," *IEEE Trans. Biomed. Eng.*, vol. 61, no. 3, pp. 705-710, March 2014.
[17] C. G. Roessler et al., "Acoustic injectors for drop-on-demand serial femtosecond crystallography," *Structure*, vol. 24, no. 4, pp. 631-640, 2016.
[18] G. R. Lockwood, D. H. Turnbull, and F. S. Foster, "Fabrication of high frequency spherically shaped ceramic transducers," *IEEE Trans. Ultrason., Ferroelectr., Freq. Control*, vol. 41, no. 2, pp. 231-235, March 1994.
[19] M. Lu et al., "Design and experiment of 256-element ultrasound phased array for noninvasive focused ultrasound surgery," *Ultrasonics*, vol. 44, pp. 325-330, December 2006.
[20] K. Yamada and H. Shimizu, "Planar-structure focusing lens for acoustic microscope," in *Proc. IEEE Int. Ultrason. Symp.*, October 1985, pp. 755-758.
[21] Y. Tang, L. Wang, Y. Wang, and E. S. Kim, "On-demand, heatless ejection of sub-MM-sized liquid droplets," in *Proc. IEEE 30th Int. Conf. Micro Electro Mech. Syst.* (MEMS), January 2017, pp. 1196-1199.
[22] C.-Y. Lee, H. Yu, and E. S. Kim, "Harmonic operation of acoustic transducer for droplet ejection application," in *Proc. Transducers Int. Solid-State Sensors, Actuat. Microsyst. Conf.*, June 2007, pp. 1283-1286.
[23] Y. Tang and E. S. Kim, "Electrical tuning of focal size with single focused ultrasonic transducer," in *Proc. IEEE Int. Ultrason. Symp.*, October 2018, pp. 1-4.
[24] M. Sahin, K. Ayranci, E. Kosun, and E. Ayranci, "Density, sound velocity and viscosity properties of aqueous sodium metatungstate solutions and an application of these solutions in heavy mineral separations," *Chem. Geol.*, vol. 264, nos. 1-4, pp. 96-100, June 2009.
[25] W. L. Nyborg, "Acoustic streaming due to attenuated plane waves," *J. Acoust. Soc. Amer.*, vol. 25, no. 1, pp. 68-75, January 1953.
[26] Y. Zhong, H. Fang, Q. Ma, and X. Dong, "Analysis of droplet stability after ejection from an inkjet nozzle," *J. Fluid Mech.*, vol. 845, pp. 378-391, June 2018.

What is claimed is:

1. A device for picking and placing semiconductor chips, the device comprising:
   a liquid having a first surface and a second surface, the first surface being a liquid-air interface;
   a layer of semiconductor chips disposed over the first surface; and
   a focused ultrasonic transducer positioned to focus acoustic wave on the layer of semiconductor chips such that a droplet including at least one semiconductor chip is ejected through the air interface per each actuation of the focused ultrasonic transducer through droplet ejection, the focused ultrasonic transducer including:
      a piezoelectric substrate having a top face and a bottom face;
      a Fresnel acoustic lens including a plurality of annular rings of air cavities disposed on the top face; and
      a first patterned circular electrode disposed over the top face and a second patterned circular electrode disposed over the bottom face, the first patterned circular electrode overlapping the second patterned circular electrode.

2. The device of claim 1 wherein the droplet includes a single semiconductor chip.

3. The device of claim 1 further comprising a collection plate for collecting ejected droplets.

4. The device of claim 1 further comprising a cover that defines a flow channel to guide the semiconductor chips to an ejection site.

5. The device of claim 4 wherein the cover defines visual indicator to align the cover to a center Fresnel circle of the focused ultrasonic transducer.

6. The device of claim 4 further comprising a precision stage that holds the cover at the first surface thereby allowing fine-tuning of a liquid level held by surface tension.

7. The device of claim 1, wherein a plurality of focused ultrasonic transducers is configured to eject a plurality of semiconductor chips onto a plurality of receiving sites.

8. The device of claim 1, wherein a plurality of covers is configured to guide a plurality of semiconductor chips to a plurality of ejection sites, each cover defining a flow channel to guide the semiconductor chips to its ejection site.

9. The device of claim 1, wherein the focused ultrasonic transducer is configured to operate at a plurality of different frequencies.

10. The device of claim 1 wherein the focused ultrasonic transducer defines a focal length from about 0.5 mm to about 40 mm.

11. The device of claim 1, wherein the focused ultrasonic transducer is configured to operate at a plurality of focal lengths.

12. The device of claim 1, wherein the focused ultrasonic transducer is configured to operate at a plurality of focal sizes.

13. The device of claim 1, wherein the focused ultrasonic transducer is configured to produce a plurality of focal lengths and also a plurality of focal sizes by varying at least one of the magnitude and the pulsewidth of the applied voltage.

14. The device of claim 1, wherein the focused ultrasonic transducer includes:
a first metal layer disposed over the top face, the first metal layer being a patterned metal layer defining the first patterned circular electrode; and
a second metal layer disposed over the bottom face, the second metal layer defining the second patterned circular electrode and
wherein the plurality of annular rings of air cavities is disposed over the first metal layer, the plurality of annular rings of air cavities being patterned into Fresnel half-wavelength annular rings.

15. The device of claim 1, wherein the piezoelectric substrate comprises lead zirconate titanate.

16. The device of claim 1, wherein the piezoelectric substrate has an ultrasonic fundamental thickness-mode resonant frequency.

17. The device of claim 1, wherein the piezoelectric substrate has a fundamental thickness-mode resonant frequency from about 1 to 180 MHz.

18. A method for picking and placing semiconductor chips, the method comprising:
providing a layer of semiconductor chips disposed over a first surface of a liquid, the first surface being a liquid-air; and
focusing an acoustic wave on the layer of semiconductor chips with a focused ultrasonic transducer such that a droplet including at least one semiconductor chip is ejected through the liquid-air interface per each actuation of the focused ultrasonic transducer through droplet ejection, the focused ultrasonic transducer including:
a piezoelectric substrate having a top face and a bottom face;
a Fresnel acoustic lens including a plurality of annular rings of air cavities disposed on the top face; and
a first patterned circular electrode disposed over the top face and a second patterned circular electrode disposed over the bottom face, the first patterned circular electrode overlapping the second patterned circular electrode.

19. The method of claim 18 further collecting ejected droplets with a collection plate.

20. The method of claim 18 further placing ejected droplets onto a plurality of different locations on a collection plate.

21. The method of claim 18 wherein a cover defines a flow channel to guide the semiconductor chips to an ejection site.

22. The method of claim 18, wherein the focused ultrasonic transducer is configured to operate at a plurality of different frequencies, a plurality of different voltage amplitudes, and/or a plurality of different pulsewidths.

23. The method of claim 18, wherein the focused ultrasonic transducer defines a focal length from about 0.5 mm to about 40 mm.

* * * * *